US011594550B2

(12) United States Patent
Kim et al.

(10) Patent No.: US 11,594,550 B2
(45) Date of Patent: Feb. 28, 2023

(54) NONVOLATILE MEMORY DEVICE WITH H-SHAPED BLOCKS AND METHOD OF FABRICATING THE SAME

(71) Applicant: Samsung Electronics Co., Ltd., Suwon-si (KR)

(72) Inventors: Kang Min Kim, Hwaseong-si (KR); Seung Min Song, Seoul (KR); Jae Hoon Shin, Suwon-si (KR); Joong Shik Shin, Yongin-si (KR); Geun Won Lim, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/852,907

(22) Filed: Apr. 20, 2020

(65) Prior Publication Data

US 2021/0111186 A1 Apr. 15, 2021

(30) Foreign Application Priority Data

Oct. 11, 2019 (KR) .......................... 10-2019-0125849

(51) Int. Cl.
*H01L 27/11582* (2017.01)
*H01L 27/11573* (2017.01)
*H01L 23/528* (2006.01)
*H01L 21/311* (2006.01)
*H01L 27/11565* (2017.01)

(52) U.S. Cl.
CPC ... *H01L 27/11582* (2013.01); *H01L 21/31111* (2013.01); *H01L 23/528* (2013.01); *H01L 27/11565* (2013.01); *H01L 27/11573* (2013.01)

(58) Field of Classification Search
CPC ............... H01L 27/115–11597; H01L 23/5283
See application file for complete search history.

(56) References Cited

U.S. PATENT DOCUMENTS

| 8,409,977 | B2 | 4/2013 | Shim et al. |
| 9,281,316 | B2 | 3/2016 | Lee |
| 9,368,646 | B2 | 6/2016 | Kim et al. |

(Continued)

OTHER PUBLICATIONS

German office action dated Apr. 4, 2022 for corresponding German Patent Application No. 102020116136.0.

*Primary Examiner* — Didarul A Mazumder
*Assistant Examiner* — Gustavo G Ramallo
(74) *Attorney, Agent, or Firm* — Harness, Dickey & Pierce, P.L.C.

(57) ABSTRACT

A nonvolatile memory device with improved product reliability and a method of fabricating the same is provided. The nonvolatile memory device comprises a substrate, a first mold structure disposed on the substrate and including a plurality of first gate electrodes, a second mold structure disposed on the first mold structure and including a plurality of second gate electrodes and a plurality of channel structures intersecting the first gate electrodes and the second gate electrodes by penetrating the first and second mold structures, wherein the first mold structure includes first and second stacks, which are spaced apart from each other, and the second mold structure includes a third stack, which is stacked on the first stack, a fourth stack, which is stacked on the second stack, and first connecting parts, which connect the third and fourth stacks.

20 Claims, 30 Drawing Sheets

(56) References Cited

U.S. PATENT DOCUMENTS

| | | |
|---|---|---|
| 9,640,549 B2 | 5/2017 | Lee et al. |
| 2010/0112769 A1 | 5/2010 | Son et al. |
| 2012/0061744 A1* | 3/2012 | Hwang ............. H01L 27/11573 |
| | | 257/324 |
| 2015/0069484 A1* | 3/2015 | Lee .................... H01L 21/30604 |
| | | 257/314 |
| 2017/0200676 A1* | 7/2017 | Jeong ................ H01L 27/11556 |
| 2017/0207232 A1* | 7/2017 | You .................... H01L 27/11521 |
| 2017/0207238 A1* | 7/2017 | Lee .................... H01L 29/42344 |
| 2017/0294388 A1 | 10/2017 | Yoon et al. |
| 2018/0323213 A1 | 11/2018 | Arai |
| 2018/0374862 A1 | 12/2018 | Lee et al. |
| 2019/0139978 A1 | 5/2019 | Kim et al. |
| 2019/0139985 A1 | 5/2019 | Kim et al. |
| 2019/0181150 A1 | 6/2019 | Sakamoto et al. |

\* cited by examiner

United States Patent US 11,594,550 B2

NONVOLATILE MEMORY DEVICE WITH H-SHAPED BLOCKS AND METHOD OF FABRICATING THE SAME

CROSS-REFERENCE TO RELATED APPLICATION

This application claims priority to Korean Patent Application No. 10-2019-0125849, filed on Oct. 11, 2019, and all the benefits accruing therefrom under 35 U.S.C. § 119, the disclosure of which is incorporated herein by reference in its entirety.

BACKGROUND

1. Technical Field

The present disclosure relates to a nonvolatile memory device and a method of fabricating the same, and more particularly, to a nonvolatile memory device including a word line cut region and a method of fabricating the nonvolatile memory device.

2. Description of the Related Art

A semiconductor memory device is largely classified into a volatile memory device or a nonvolatile memory device.

In order to satisfy consumers' demand for improved performance and/or cheaper price, the integration density of nonvolatile memory devices has increased. The integration density of a two-dimensional (2D) or planar memory device is determined by the area occupied by each unit memory cell. Recently, a three-dimensional (3D) memory device has been developed in which unit memory cells are vertically arranged.

SUMMARY

Embodiments of the present disclosure provide a nonvolatile memory device with improved product reliability.

Embodiments of the present disclosure provide a method of fabricating a nonvolatile memory device with improved product reliability.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, there is provided a nonvolatile memory device comprising, a substrate, a first mold structure on the substrate and including a plurality of first gate electrodes, a second mold structure on the first mold structure and including a plurality of second gate electrodes and a plurality of channel structures intersecting the first gate electrodes and the second gate electrodes by penetrating the first and second mold structures, wherein the first mold structure includes first and second stacks, which are spaced apart from each other, and the second mold structure includes a third stack, stacked on the first stack, a fourth stack, stacked on the second stack, and first connecting parts, which connect the third and fourth stacks.

According to the aforementioned and other embodiments of the present disclosure, there is provided a nonvolatile memory device comprising a substrate, a first mold structure on the substrate and including a plurality of first gate electrodes, a second mold structure on the first mold structure and including a plurality of second gate electrodes, a plurality of channel structures intersecting the first gate electrodes and the second gate electrodes by penetrating the first and second mold structures and bit lines extending in a first direction, the bit lines being connected to the channel structures, wherein the first mold structure includes a first block trench, which extends in a second direction that intersects the first direction, to completely cut the first mold structure, the second mold structure includes a plurality of second block trenches, which expose part of the first block trench, and the second block trenches are spaced apart from one another and are arranged in the second direction.

According to an embodiment of the present disclosure, there is provided a nonvolatile memory device comprising a substrate, a first mold structure on the substrate and including a plurality of first gate electrodes, a second mold structure on the first mold structure and including a plurality of second gate electrodes, a plurality of channel structures intersecting the first gate electrodes and the second gate electrodes by penetrating the first and second mold structures bit lines extending in a first direction, the bit lines being connected to the channel structures, a first word line trench extending in a second direction that intersects the first direction, the first word line trench cutting the first gate electrodes and the second gate electrodes, a second word line trench extending in the second direction, the second word line trench cutting the first gate electrodes and the second gate electrodes and a first block trench extending, between the first and second word line trenches, in the second direction, the first block trench cutting the first gate electrodes, wherein the first mold structure includes first and second stacks, which are separated by the first block trench, and the second mold structure includes a third stack, stacked on the first stack, a fourth stack, stacked on the second stack, and a plurality of first connecting parts, which connect the third and fourth stacks.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

A nonvolatile memory device according to some embodiments of the present disclosure will hereinafter be described with reference to FIGS. 1 through 17.

Figure 1:
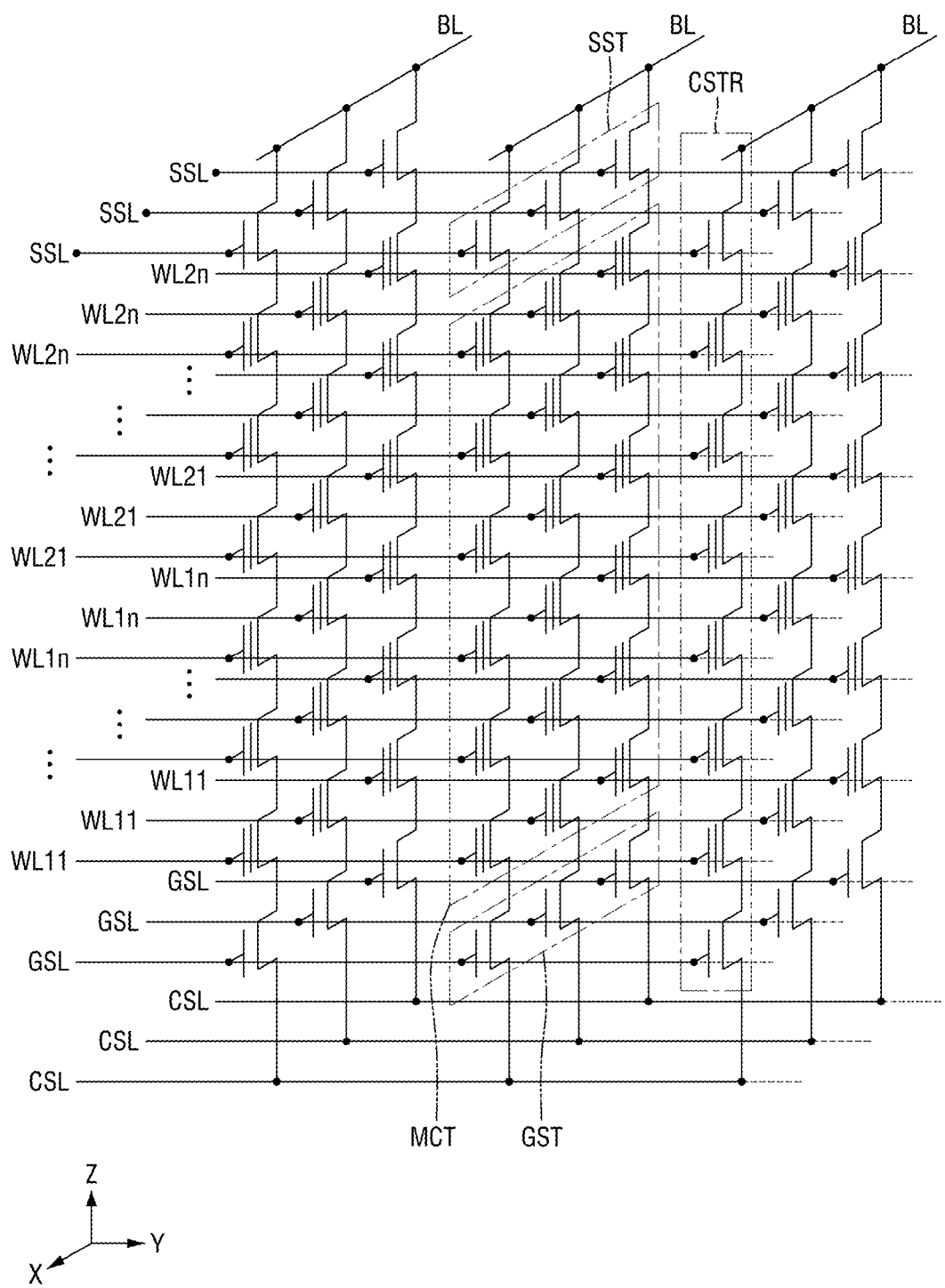
FIG. 1 is a circuit diagram of a nonvolatile memory device according to some embodiments of the present disclosure.

FIG. 1 is a circuit diagram of a nonvolatile memory device according to some embodiments of the present disclosure.

A memory cell array of the nonvolatile memory device according to some embodiments of the present disclosure may include common source lines CSL, a plurality of bit lines BL, and/or a plurality of cell strings CSTR.

The bit lines BL may be arranged two-dimensionally. For example, the bit lines BL may be spaced apart from one another and may extend in a first direction X. Multiple cell strings CSTR may be connected in parallel to each of the bit lines BL. The cell strings CSTR may be connected in common to the common source lines CSL. That is, the cell strings CSTR may be disposed between the common source lines CSL and the bit lines BL.

In some embodiments, the common source lines CSL may be arranged two-dimensionally. For example, the common source lines CSL may be spaced apart from one another and may extend in a second direction Y. The same voltage may be applied to the common source lines CSL, or different voltages may be applied to the common source lines CSL so that the common source lines CSL can be controlled separately.

Each of the cell strings CSTR may include a ground selection transistor GST, which is connected to one of the common source lines CSL, a string selection transistor SST, which is connected to one of the bit lines BL, and a plurality of memory cell transistors MCT, which are disposed between the ground selection transistor GST and the string selection transistor SST. Each of the memory cell transistors MCT may include a data storage element. The ground selection transistor GST, the string selection transistor SST, and the memory cell transistors MCT may be connected in series.

The common source lines CSL may be connected in common to the sources of ground selection transistors GST. Also, ground selection lines GSL, a plurality of word lines (WL11 through WL1n and WL21 through WL2n), and string selection lines SSL may be disposed between the common source lines CSL and the bit lines BL. The ground selection lines GSL may be used as the gate electrodes of the ground selection transistor GST, and the word lines (WL11 through WL1n and WL21 through WL2n) may be used as the gate electrodes of memory cell transistors MCT, and the string selection lines SSL may be used as the gate electrodes of string selection transistors SST.

Figure 2:
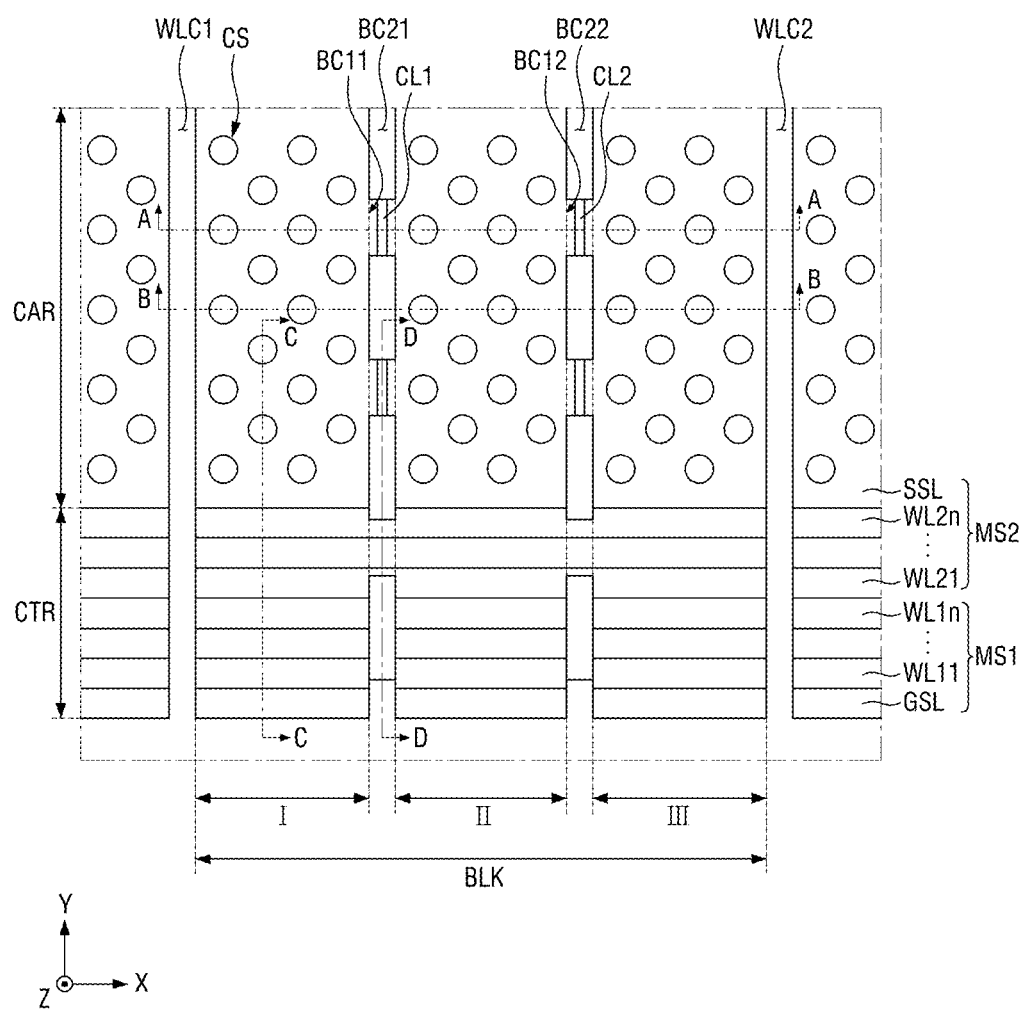
FIG. 2 is a layout view of a nonvolatile memory device according to some embodiments of the present disclosure.
Figure 3:
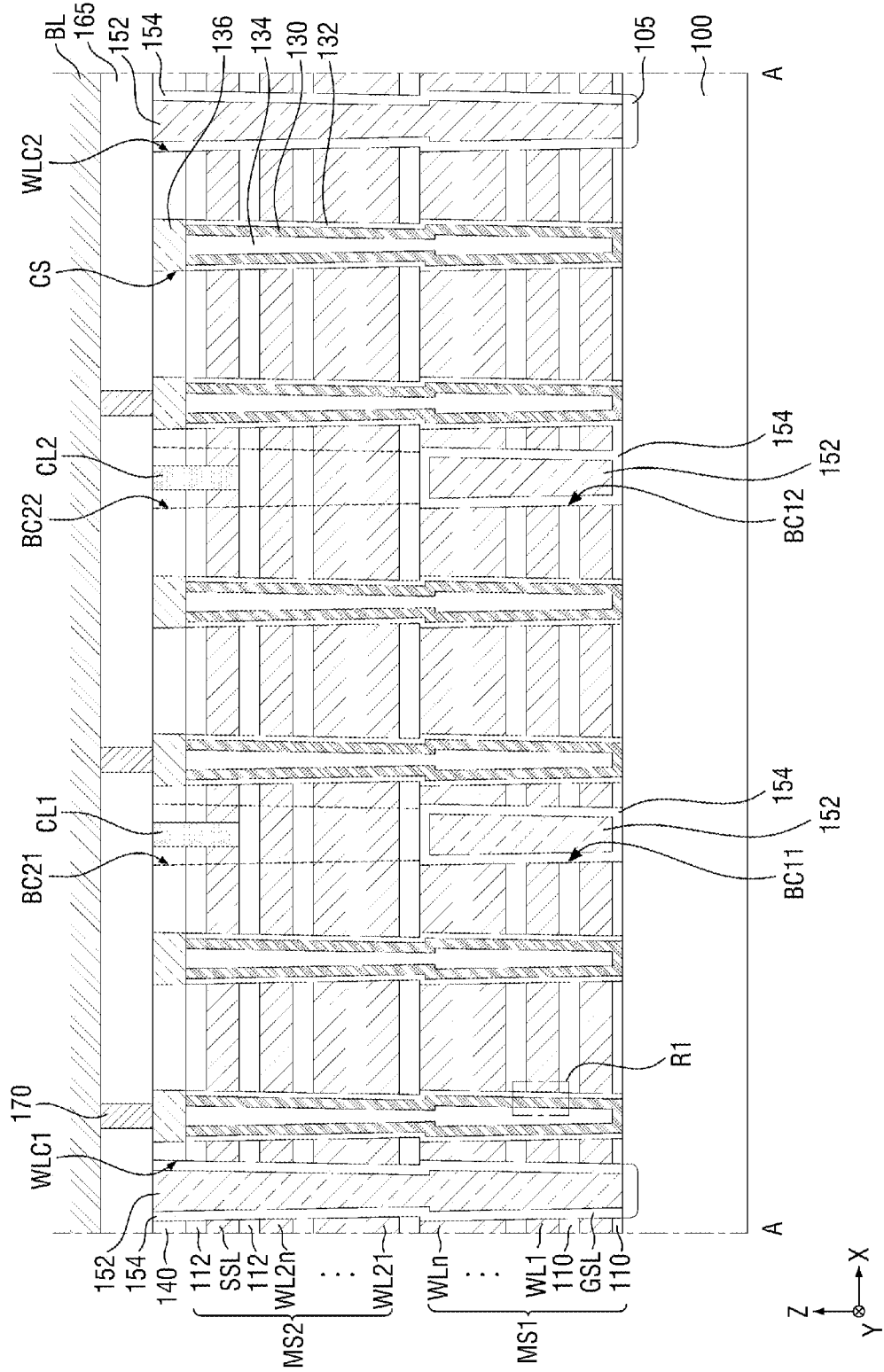
FIG. 3 is a cross-sectional view taken along line A-A of FIG. 2.
Figure 4:
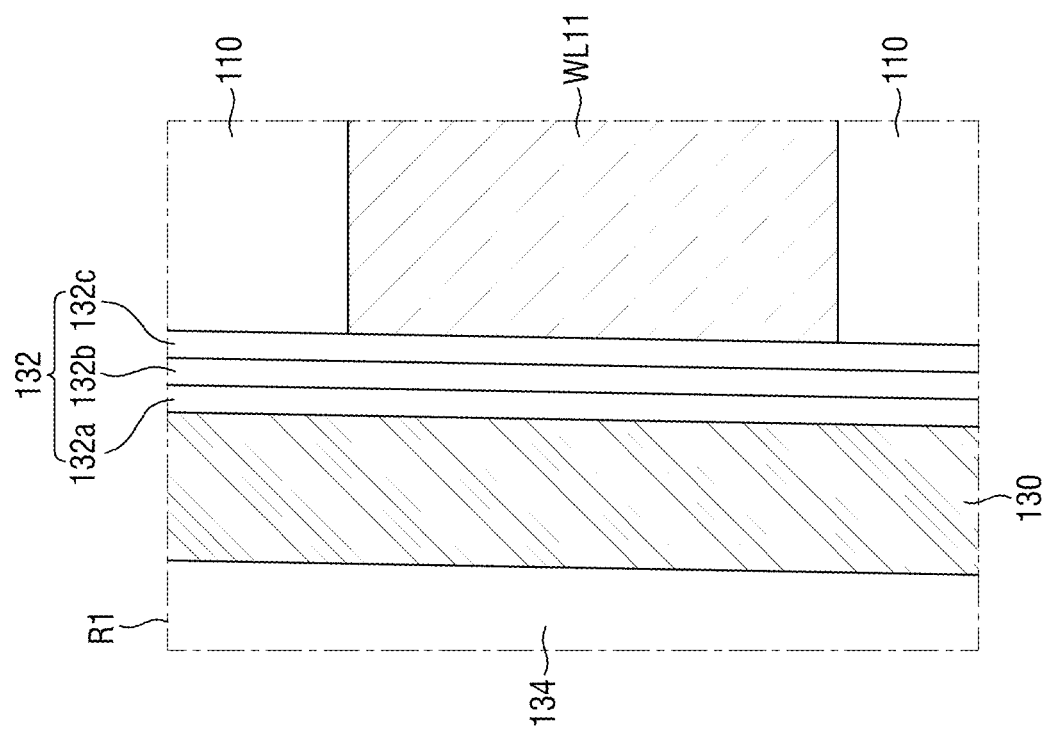
FIG. 4 is an enlarged cross-sectional view illustrating part R1 of FIG. 3.
Figure 5:
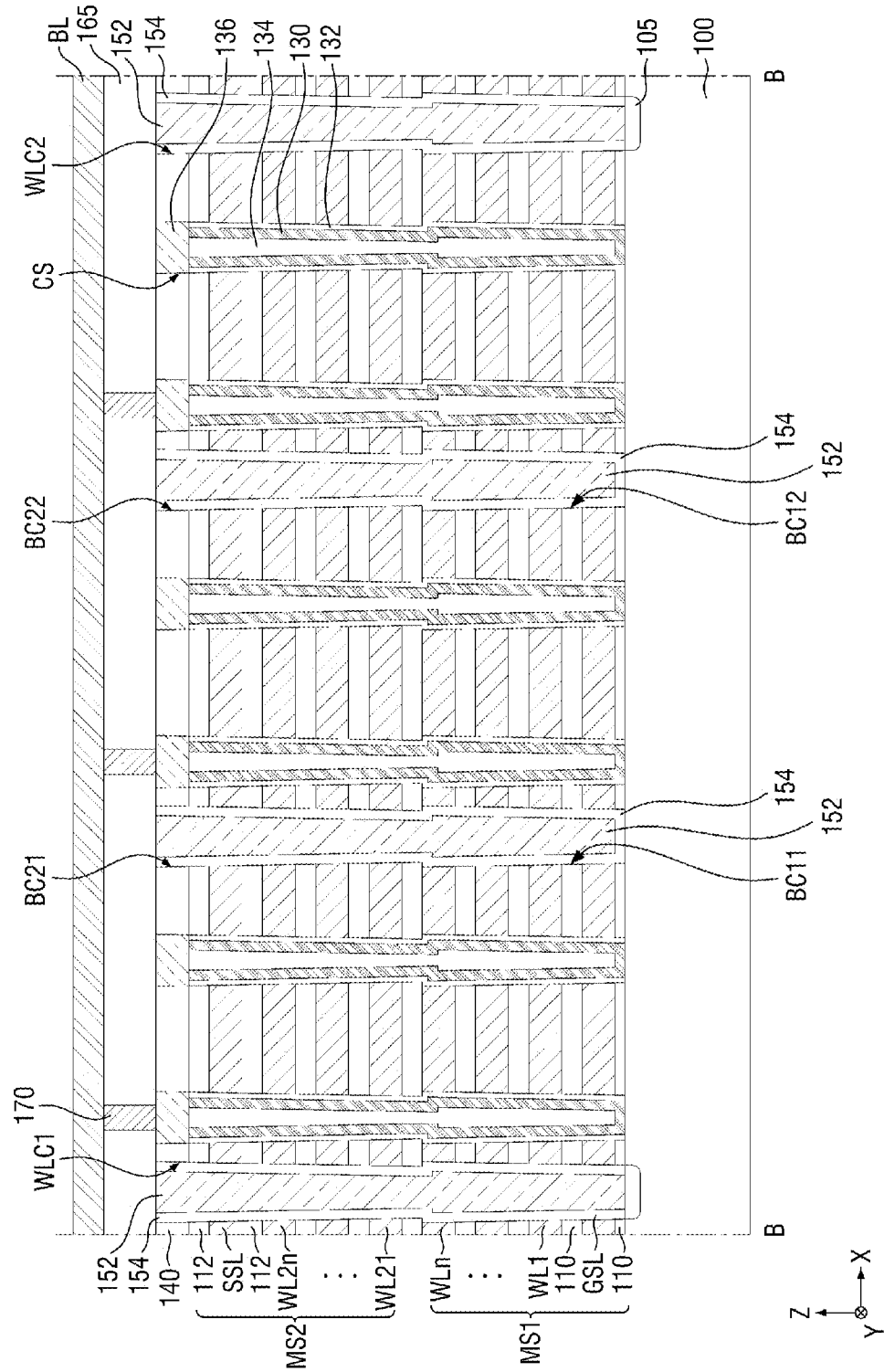
FIG. 5 is a cross-sectional view taken along line B-B of FIG. 2.
Figure 6:
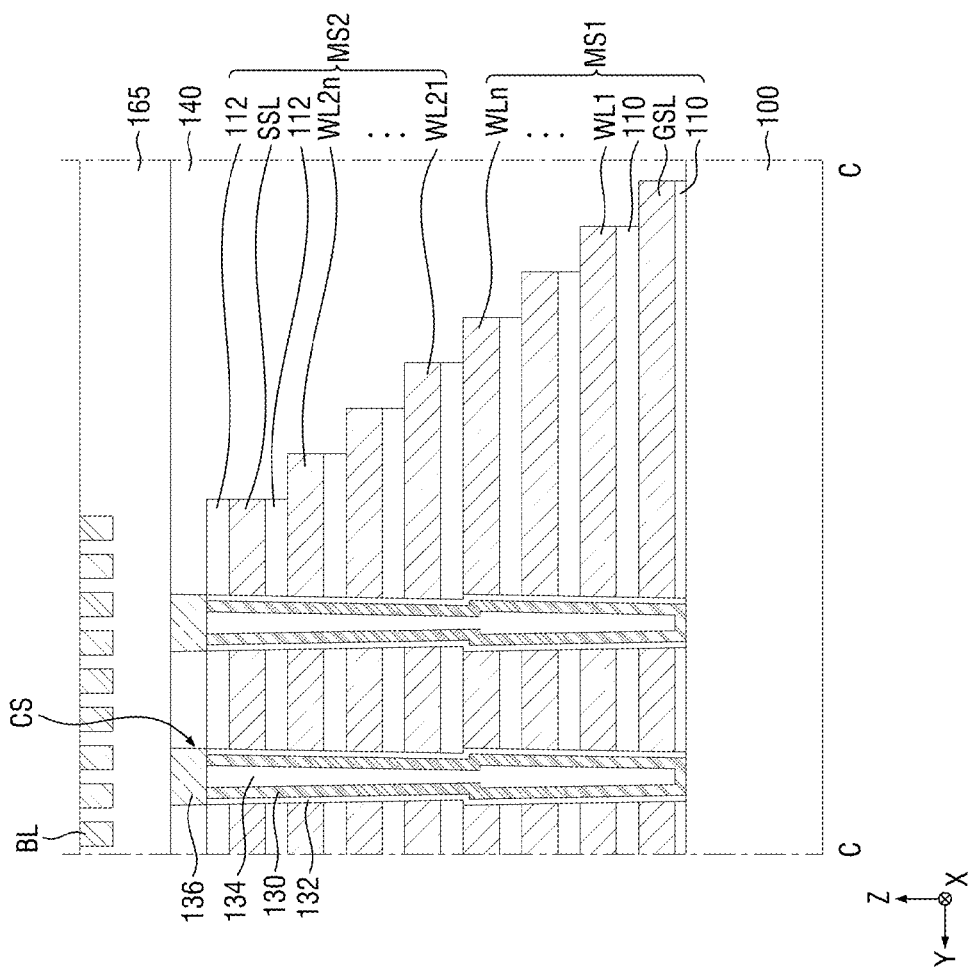
FIG. 6 is a cross-sectional view taken along line C-C of FIG. 2.
Figure 7:
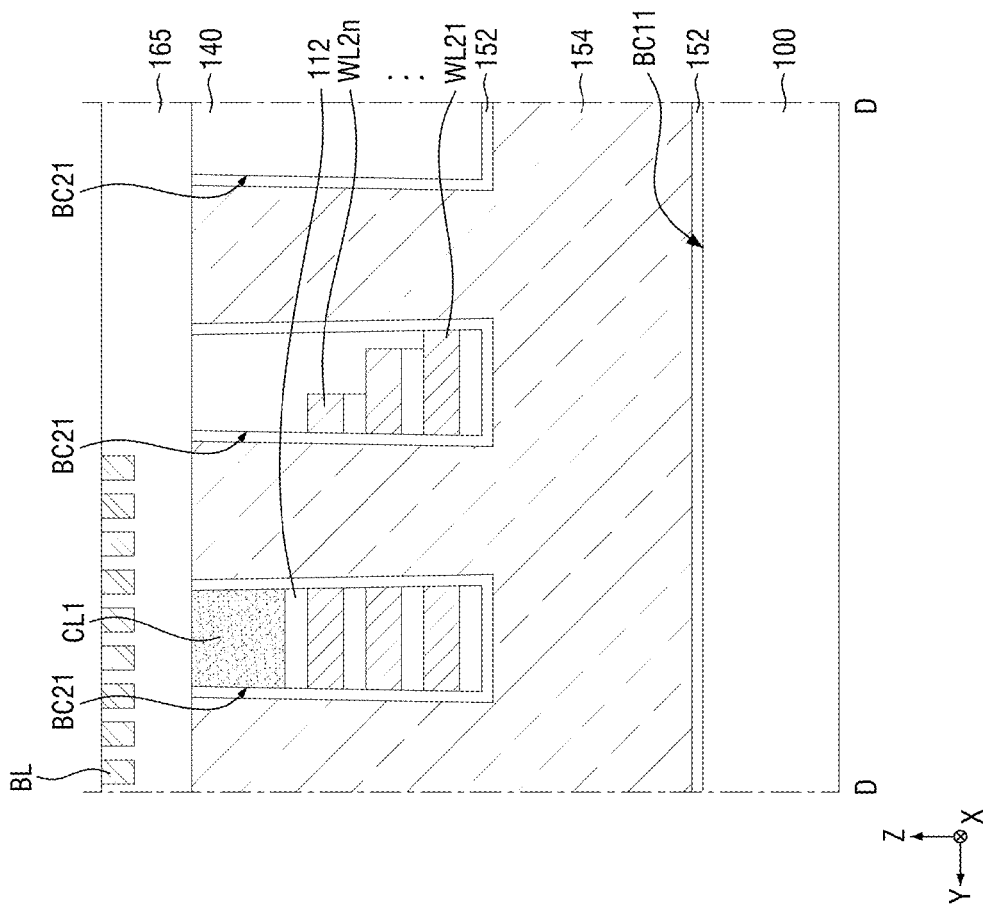
FIG. 7 is a cross-sectional view taken along line D-D of FIG. 2.

FIG. 2 is a layout view of a nonvolatile memory device according to some embodiments of the present disclosure. FIG. 3 is a cross-sectional view taken along line A-A of FIG. 2. FIG. 4 is an enlarged cross-sectional view illustrating part R1 of FIG. 3. FIG. 5 is a cross-sectional view taken along line B-B of FIG. 2. FIG. 6 is a cross-sectional view taken along line C-C of FIG. 2. FIG. 7 is a cross-sectional view taken along line D-D of FIG. 2. For convenience, bit lines BL are not illustrated in FIG. 2.

Referring to FIGS. 2 through 7, the nonvolatile memory device according to some embodiments of the present disclosure includes a substrate 100, a first mold structure MS1, a second mold structure MS2, a plurality of channel structures CS, and/or a plurality of bit lines BL.

The substrate 100 may include a semiconductor substrate such as, for example, a silicon substrate, a germanium substrate, or a silicon-germanium substrate, or may include a silicon-on-insulator (SOI) substrate or a germanium-on-insulator (GOI) substrate.

The substrate 100 may include a cell array region CAR and a contact region CTR.

A memory cell array including a plurality of memory cells may be formed in the cell array region CAR. The memory cell array may include the plurality of memory cells, a plurality of word lines, which are electrically connected to the plurality of memory cells, and the bit lines BL, which are electrically connected to the plurality of memory cells. For example, in the cell array region CAR, the first mold structure MS1, the second mold structure MS2, the channel structures CS, and the bit line BL may be formed.

The contact region CTR may be disposed near the cell array region CAR. A plurality of gate electrodes (GSL, WL11 through WL1n, WL21 through WL2n, and SSL) may be stacked in a step-like fashion. Also, memory cell contacts (not illustrated), which are connected to the gate electrodes (GSL, WL11 through WL1n, WL21 through WL2n, and SSL), may be formed in the contact region CTR. For example, the memory cell contacts may be formed to be connected to the electrodes (GSL, WL11 through WL1n, WL21 through WL2n, and SSL) through first and second interlayer insulating films 140 and 165.

The first mold structure MS1 may be formed on the substrate 100. The first mold structure MS1 may include a plurality of first gate electrodes (GSL and WL11 through WL1n) and a plurality of first insulating patterns 110, and the first gate electrodes (GSL and WL11 through WL1n) and the first insulating patterns 110 are alternately stacked on the substrate 100. For example, the first gate electrodes (GSL and WL11 through WL1n) and the first insulating patterns 110 may be in the shape of layers extending in first and second directions X and Y. The first gate electrodes (GSL and WL11 through WL1n) and the first insulating patterns 110 may be alternately stacked in a third direction Z that intersects (i.e., is perpendicular to) the top surface of the substrate 100.

In some embodiments, the first gate electrodes (GSL and WL11 through WL1n) may include a ground selection line GSL and a plurality of first word lines WL11 through WL1n, and the ground selection line GSL and the first word lines WL11 through WL1n are sequentially stacked on the substrate 100. In some embodiments, the ground selection line GSL may be the lowermost gate electrode among the first gate electrodes (GSL and WL11 through WL1n).

The second mold structure MS2 may be formed on the first mold structure MS1. The second mold structure MS2 may include a plurality of second gate electrodes (WL21 through WL2n and SSL) and a plurality of second insulating patterns 112, and the second gate electrodes (WL21 through WL2n and SSL) and the second insulating patterns 112 are alternately stacked on the first mold structure MS1. For example, the second gate electrodes (WL21 through WL2n and SSL) and the second insulating patterns 112 may be in the shape of layers extending in the first and second directions X and Y. The second gate electrodes (WL21 through WL2n and SSL) and the second insulating patterns 112 may be alternately stacked in the third direction Z.

In some embodiments, the second gate electrodes (WL21 through WL2n and SSL) may include a plurality of second word lines WL21 through WL2n and a string selection line SSL, and the second word lines WL21 through WL2n and the string selection line SSL are sequentially stacked on the first mold structure MS1. In some embodiments, the string selection line SSL may be the uppermost gate electrode among the second gate electrodes (WL21 through WL2n and SSL).

The first gate electrodes (GSL and WL11 through WL1n) and the second gate electrodes (WL21 through WL2n and SSL) may include a conductive material. For example, the first gate electrodes (GSL and WL11 through WL1n) and the second gate electrodes (WL21 through WL2n and SSL) may include a metal such as tungsten (W), cobalt (Co), or nickel (Ni) or a semiconductor material such as silicon, but the present disclosure is not limited thereto.

The first insulating patterns 110 and the second insulating patterns 112 may include an insulating material. For example, the first insulating patterns 110 and the second insulating patterns 112 may include silicon oxide, but the present disclosure is not limited thereto.

The channel structures CS may penetrate the first and second mold structures MS1 and MS2. The channel structures CS may extend in a direction that intersects the gate electrodes (GSL, WL11 through WL1n, WL21 through WL2n, and SSL). For example, the channel structures CS may be in the shape of pillars that extend in the third direction Z. Each of the channel structures CS may include a semiconductor pattern 130 and an information storage film 132.

The semiconductor pattern 130 may penetrate the first and second mold structures MS1 and MS2. For example, the semiconductor pattern 130 may extend in the third direction Z. The semiconductor pattern 130 is illustrated as being in the shape of a cup, but the present disclosure is not limited thereto. For example, the semiconductor pattern 130 may be in various shapes such as a cylindrical shape, a rectangular shape, or a non-hollow pillar shape.

The semiconductor pattern 130 may include a semiconductor material such as, for example, monocrystalline silicon, polycrystalline silicon, an organic semiconductor material, or a carbon nano-structure, but the present disclosure is not limited thereto.

The information storage film 132 may be interposed between the semiconductor pattern 130 and the gate electrodes (GSL, WL11 through WL1n, WL21 through WL2n, and SSL). For example, the information storage film 132 may extend along the sides of the semiconductor pattern 130.

The information storage film 132 may include at least one of, for example, silicon oxide, silicon nitride, silicon oxynitride, and a high-k material having a greater dielectric constant than silicon oxide. The high-k material may include at least one of, for example, aluminum oxide, hafnium oxide, lanthanum oxide, tantalum oxide, titanium oxide, lanthanum hafnium oxide, lanthanum aluminum oxide, dysprosium scandium oxide, and a combination thereof.

In some embodiments, the information storage film 132 may include a plurality of films. For example, as illustrated in FIG. 4, the information storage film 132 may include a tunnel insulating film 132a, a charge storage film 132b, and a blocking insulating film 132c, which are sequentially stacked on the semiconductor pattern 130.

The tunnel insulating film 132a may include, for example, silicon oxide and a high-k material (such as aluminum oxide ($Al_2O_3$) or hafnium oxide ($HfO_2$)) having a greater dielectric constant than silicon oxide. The information storage film 132b may include, for example, silicon nitride. The blocking insulating film 132c may include, for example, silicon oxide and a high-k material (such as aluminum oxide ($Al_2O_3$) or hafnium oxide ($HfO_2$)) having a greater dielectric constant than silicon oxide.

In some embodiments, each of the channel structures CS may further include a first filling pattern 134. The first filling pattern 134 may be formed to fill the inside of the semiconductor pattern 130, which is cup-shaped. For example, the semiconductor pattern 130 may extend along the sides and the bottom surface of the first filling pattern 134. The first filling pattern 134 may include, for example, silicon oxide, but the present disclosure is not limited thereto.

In some embodiments, each of the channel structures CS may further include a channel pad 136. The channel pad 136 may be formed to be connected to an upper part of the semiconductor pattern 130. For example, the channel pad 136 may be formed in a first interlayer insulating film 140, which is formed on the first and second mold structures MS1 and MS2.

FIG. 3 illustrates that the channel pad 136 is formed on the top surface of the semiconductor pattern 130, but the present disclosure is not limited thereto. Alternatively, the upper part of the semiconductor pattern 130 may be formed to extend along the sides of the channel pad 136. The channel pad 136 may include, for example, polysilicon doped with impurities, but the present disclosure is not limited thereto.

In some embodiments, the channel structures CS may be arranged in a zigzag fashion. For example, as illustrated in FIG. 1, the channel structures CS may be arranged in a staggered manner in the first and second directions X and Y. Since the channel structures CS are arranged in a zigzag fashion, the integration density of the nonvolatile memory device according to some embodiments of the present disclosure can be further improved.

In some embodiments, the width of channel structures CS that penetrate the first mold structure MS1 may decrease close to the top surface of the substrate 100 due to the characteristics of etching for forming the channel structures CS. Also, the width of channel structures CS that penetrate the second mold structure MS2 may decrease close to the top surface of the substrate 100 due to the characteristics of etching for forming the channel structures CS.

In some embodiments, the width of parts of the channel structures CS that penetrate the uppermost surface of the first mold structure MS1 may be greater than the width of parts of the channel structures CS that penetrate the lowermost surface of the second mold structure MS2 because etching for penetrating the first mold structure MS1 and etching for penetrating the second mold structure MS2 are performed separately.

Alternatively, in some embodiments, the width of the channel structures CS may gradually decrease from the uppermost surface of the second mold structure MS2 to the lowermost surface of the first mold structure MS1. For example, etching for penetrating the first mold structure MS1 and etching for penetrating the second mold structure MS2 may be performed at the same time.

The bit lines BL may be spaced apart from, and extend in parallel to, one another. For example, the bit lines BL may extend in the first direction X. In some embodiments, the bit lines BL may be formed on the second mold structure MS2.

The bit lines BL may be connected to the channel structures CS. For example, as illustrated in FIGS. 3 and 5, the bit lines BL may be connected to the channel structures CS via bit line contacts 170. The bit line contacts 170 may electrically connect the bit lines BL and the channel structures CS through, for example, the second interlayer insulating film 165.

The first and second mold structures MS1 and MS2 may be cut by first and second word lines trenches WLC1 and WLC2. The first and second word line trenches WLC1 and WLC2 may extend in a direction that intersects the bit lines BL. For example, the first word line trench WLC1 may extend in the second direction Y to cut the first and second mold structures MS1 and MS2, and the second word line trench WLC2 may be spaced apart in the first direction X from the first word line trench WLC1 and may extend in the second direction Y to cut the first and second mold structures MS1 and MS2.

Accordingly, the first gate electrodes (GSL and WL11 through WL1n) and the second gate electrodes (WL21 through WL2n and SSL) may be cut by the first and second word line trenches WLC1 and WLC2.

Parts of the first and second mold structures MS1 and MS2 that are cut by the first and second word line trenches WLC1 and WLC2 may form a single block area BLK. For example, as illustrated in FIG. 2, the block area BLK may be defined between the first and second word line trenches WLC1 and WLC2.

In some embodiments, the first word line trench WLC1 may completely cut the first and second mold structures MS1 and MS2, and the second word line trench WLC2 may completely cut the first and second mold structures MS1 and MS2.

In some embodiments, as illustrated in FIG. 2, the first and second word line trenches WLC1 and WLC2 may be formed in and across the cell array region CAR and the contact region CTR.

In some embodiments, as illustrated in FIGS. 3 and 5, the width of parts of the first and second word line trenches WLC1 and WLC2 that cut the first mold structure MS1 may decrease close to the top surface of the substrate 100, and the width of parts of the first and second word line trenches WLC1 and WLC2 that cut the second mold structure MS2 may decrease close to the top surface of the substrate 100 because of the characteristics of etching for forming the first and second word line trenches WLC1 and WLC2.

In some embodiments, the width of parts of the first and second word line trenches WLC1 and WLC2 that cut the uppermost surface of the first mold structure MS1 may be greater than the width of parts of the first and second word line trenches WLC1 and WLC2 that cut the lowermost surface of the second mold structure MS2 because etching for cutting the first mold structure MS1 is performed separately from etching for cutting the second mold structure MS2.

The first mold structure MS1 may also be cut by first and second block trenches BC11 and BC12. The first and second block trenches BC11 and BC12 may be interposed between the first and second word line trenches WLC1 and WLC2. That is, the first and second block trenches BC11 and BC12 may cut the first mold structure MS1 in the block area BLK.

The first and second block trenches BC11 and BC12 may define a plurality of blocks (I, II, and III) in the block area BLK. For example, as illustrated in FIG. 2, the first block trench BC11 may define first and second blocks I and II, and the second trench BC12 may define the second block II and a third block III.

In some embodiments, the first and second block trenches BC11 and BC12 may be formed in and across the cell array region CAR and the contact region CTR.

In some embodiments, as illustrated in FIGS. 3 and 5, the width of the first and second block trenches BC11 and BC12 may decrease close to the top surface of the substrate 100 because of the characteristics of etching for forming the first and second block trenches BC11 and BC12.

Alternatively, in some embodiments, the first and second block trenches BC11 and BC12 may completely cut the first mold structure MS1, and this will be described later in detail with reference to FIG. 8.

The second mold structure MS2 may also be cut by third and fourth block trenches BC21 and BC22. The third and fourth block trenches BC21 and BC22 may be interposed between the first and second word line trenches WLC1 and WLC2. That is, the third and fourth block trenches BC21 and BC22 may cut the second mold structure MS2 in the block area BLK.

In some embodiments, as illustrated in FIG. 2, the third and fourth block trenches BC21 and BC22 may be formed in and across the cell array region CAR and the contact region CTR.

In some embodiments, as illustrated in FIGS. 3 and 5, the width of the third and fourth block trenches BC21 and BC22 may decrease close to the top surface of the substrate 100 because of the characteristics of etching for forming the third and fourth block trenches BC21 and BC22.

In some embodiments, the width of uppermost parts of the first and second block trenches BC11 and BC12 may be greater than the width of lowermost parts of the third and fourth block trenches BC21 and BC22 because etching for cutting the first mold structure MS1 is performed separately from etching for cutting the second mold structure MS2.

In some embodiments, the third and fourth block trenches BC21 and BC22 may only partially cut the second mold structure MS2, and this will be described later in detail with reference to FIG. 8.

In some embodiments, spacers 154 and second filling patterns 152 may be formed in the first and second word line trenches WLC1 and WLC2 and the first, second, third, and fourth block trenches BC11, BC12, BC21, and BC22.

The spacers 154 may extend along the profiles of the first and second word line trenches WLC1 and WLC2 and the profiles of the first, second, third, and fourth block trenches BC11, BC12, BC21, and BC22. The second filling patterns 152 may be formed to fill parts of the first and second word line trenches WLC1 and WLC2 and the first, second, third, and fourth block trenches BC11, BC12, BC21, and BC22 that remain unfilled by the spacers 154.

In some embodiments, second filling patterns 152 that fill the first and second word line trenches WLC1 and WLC2 may be provided as the common source lines (CSL of FIG. 1) of the nonvolatile memory device according to some embodiments of the present disclosure. For example, the second filling patterns 152 may include a conductive material. The second filling patterns 152 that fill the first and second word line trenches WLC1 and WLC2 may be connected to the substrate 100 through the first and second mold structures MS1 and MS2.

In some embodiments, the second filling patterns 152 may be connected to an impurity region 105 in the substrate 100. The impurity region 105 may extend in, for example, the second direction Y.

The spacers 154 may include an insulating material. Accordingly, the second filling patterns 152 may be electrically separated from the first gate electrodes (GSL and WL11 through WL1n) and the second gate electrodes (WL21 through WL2n and SSL).

In some embodiments, second filling patterns 152 that fill the first, second, third, and fourth block trenches BC11, BC12, BC21, and BC22 may not be connected to the substrate 100. For example, as illustrated in FIGS. 3 and 5, the spacers 154 may extend along the bottoms of the first and second block trenches BC11 and BC12.

However, the present disclosure is not limited to this. Alternatively, only an insulating material may be formed in the first and second word line trenches WLC1 and WLC2 and the first, second, third, and fourth block trenches BC11, BC12, BC21, and BC22.

In some embodiments, the second mold structure MS2 may further include first and second cutting lines CL1 and CL2. The first and second cutting lines CL1 and CL2 may be interposed between the first and second word line trenches WLC1 and WLC2.

The first and second cutting lines CL1 and CL2 may cut the string selection line SSL. For example, as illustrated in FIG. 3, the first cutting line CL1 may extend in the second direction Y to cut the string selection line SSL. The second cutting line CL2 may be spaced apart in the first direction X from the first cutting line CL1 and may extend in the second direction Y to cut the string selection line SSL.

In some embodiments, as illustrated in FIG. 2, the first cutting line CL1 may be interposed between the first and second blocks I and II, and the second cutting line CL2 may be interposed between the second and third blocks II and III. Accordingly, channel structures CS in the first block I and channel structures CS in the second block II may be selectively chosen and controlled by part of the string selection line SSL that is cut by the first cutting line CL1. Similarly, the channel structures CS in the second block II and channel structures CS in the third block II may be selectively chosen and controlled by part of the string selection line SSL that is cut by the second cutting line CL2.

The first and second mold structures MS1 and SM2 of the nonvolatile memory device according to some embodiments of the present disclosure will hereinafter be described with reference to FIGS. 2 through 8.

Figure 8:
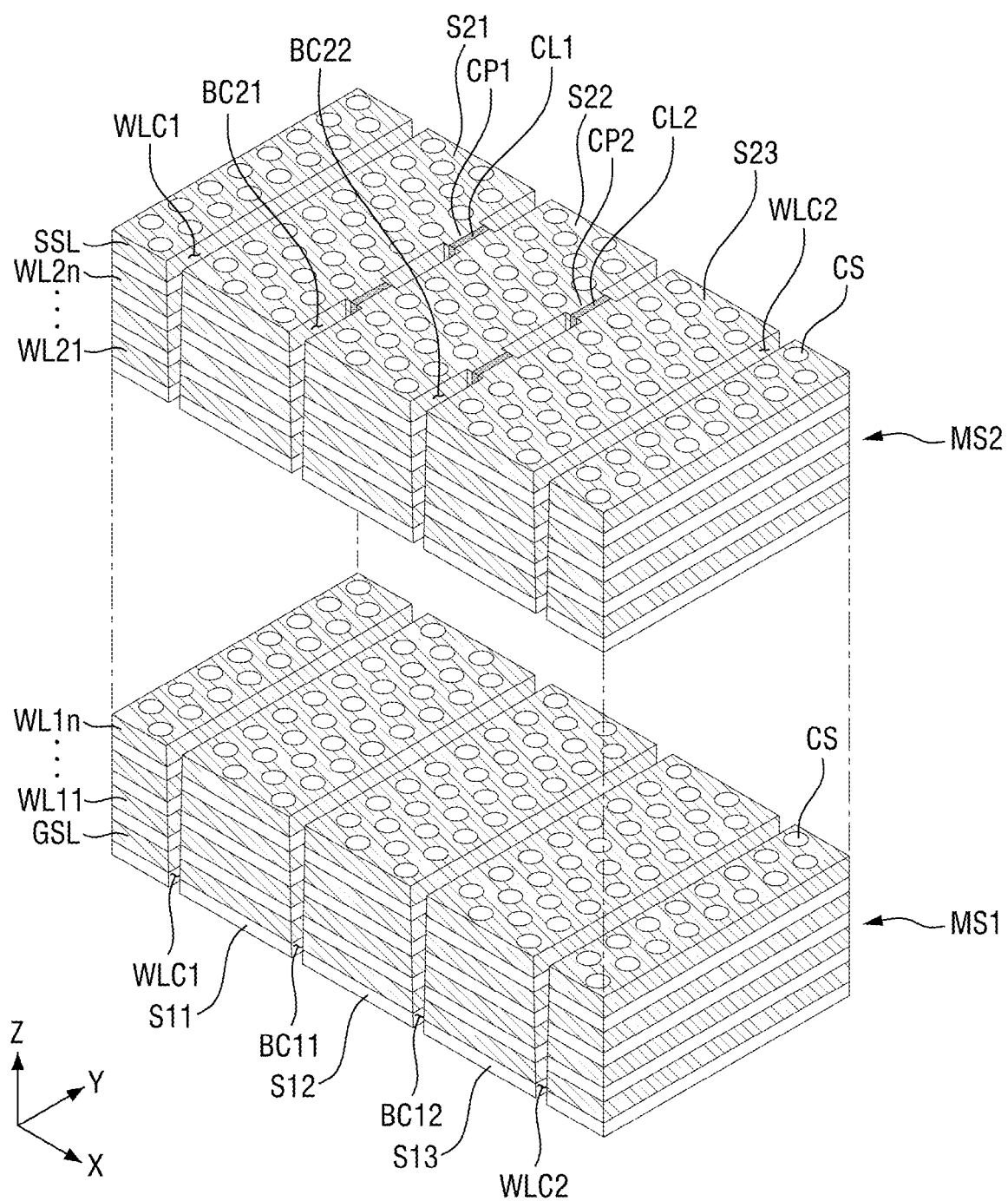
FIG. 8 is a partial exploded perspective view illustrating the first and second mold structures MS1 and MS2 of FIGS. 2 through 7.

FIG. 8 is a partial exploded perspective view illustrating the first and second mold structures MS1 and MS2 of FIGS. 2 through 7. For convenience, FIG. 8 illustrates only the cell array region CAR of FIG. 1, and the second filling patterns 152 and the spacers 154 are not illustrated in FIG. 8.

Referring to FIG. 8, the first mold structure MS1 may include the first and second block trenches BC11 and BC12, which cut the first mold structure MS1.

In some embodiments, the first and second block trenches BC11 and BC12 may completely cut the first mold structure MS1. For example, the first block trench BC11 may extend in the second direction Y to completely cut the first mold structure MS1, and the second block trench BC12 may be spaced apart in the first direction X from the first block trench BC11 and may extend in the second direction Y to completely cut the first mold structure MS1.

Accordingly, the first mold structure MS1, which is between the first and second word line trenches WLC1 and WLC2, may further include a plurality of first, second, and third stacks S11, S12, and S13, which are spaced apart from one another by the first and second block trenches BC11 and BC12. For example, the first and second stacks S11 and S12 may be separated from each other by the first block trench BC11, and the second and third stacks S12 and S13 may be separated from each other by the second block trench BC12.

The second mold structure MS2 may include a plurality of third block trenches BC21 and a plurality of fourth block trenches BC22, and the third block trenches BC21 and the fourth block trenches BC22 cut the second mold structure MS2.

In some embodiments, the third block trenches BC21 and the fourth block trenches BC22 may partially cut the second mold structure MS2. For example, the third block trenches BC21 may be spaced apart from one another and may be arranged in the second direction Y, and the fourth block trenches BC22 may be spaced apart in the first direction X from the third block trenches BC21, may be spaced apart from one another, and may be arranged in the second direction Y.

Accordingly, the second mold structure MS2, which is between the first and second word line trenches WLC1 and WLC2, may include a plurality of fourth, fifth, and sixth stacks S21, S22, and S23, which are at least partially connected by a plurality of first connecting parts CP1 and a plurality of second connecting parts CP2. For example, the fourth and fifth stacks S21 and S22 may be connected to one another by the first connecting parts CP1, and the fifth and sixth stacks S22 and S23 may be connected to one another by the second connecting parts CP2.

The fourth stack S21 may be stacked on the first stack S11, the fifth stack S22 may be stacked on the second stack S12, and the sixth stack S23 may be stacked on the third stack S13.

The first connecting parts CP1 may be spaced apart from one another and may be arranged in the second direction Y. That is, the third block trenches BC21 and the first connecting parts CP1 may be alternately arranged in the second direction Y. The second connecting parts CP2 may be spaced apart from one another and may be arranged in the second direction Y. That is, the fourth block trenches BC22 and the second connecting parts CP2 may be alternately arranged in the second direction Y.

Accordingly, the bottom surfaces of the first connecting parts CP1 and the bottom surfaces of the second connecting parts CP2 may be spaced apart from the top surface of the substrate 100. In some embodiments, the third block trenches BC21 and the first connecting parts CP1 may overlap with the first block trenches BC11 in the third direction Z, and the fourth block trenches BC22 and the second connecting parts CP2 may overlap with the second block trenches BC12 in the third direction Z.

The third block trenches BC21 may expose part of the first block trench BC11, and the fourth block trenches BC22 may expose part of the second block trench BC12. That is, the third block trenches BC21 may be connected to the first block trench BC11, and the fourth block trenches BC22 may be connected to the second block trench BC12.

In some embodiments, first cutting lines CL1 may be formed in the first connecting parts CP1, and second cutting lines CL2 may be formed in the second connecting parts CP2. In some embodiments, the width of the first connecting lines CL1 may be smaller than the width of the third block trenches BC21, and the width of the second cutting lines CL2 may be smaller than the width of the fourth block trenches BC22. The term "width", as used herein, means the width in the first direction X. Accordingly, parts of the string selection line SSL may be disposed in the first connecting parts CP1 and the second connecting parts CP2.

As the integration density of the nonvolatile memory device according to some embodiments of the present disclosure increases, the number of channel structures CS disposed in each mold structure cut by a word line trench (e.g., in the block area BLK) increases. In order to control a considerable number of channel structures CS in the block area BLK individually, each mold structure cut by a word line trench may be cut again into a plurality of blocks (e.g., the first, second, and third blocks I, II, and III).

However, as the aspect ratio (AR) of the nonvolatile memory device according to some embodiments of the present disclosure increases, a leaning phenomenon in which the first, second, and third blocks I, II, and III collapse or are tilted in one direction may occur. In order to reduce or prevent this, the block area BLK may be patterned into an "H" shape so that connecting parts that support and connect the first, second, and third blocks I, II, and III can be formed. However, these connecting parts may deteriorate the dispersion at the lower parts of mold structures and may thus lower the product reliability. For example, during the patterning of the block area BLK into an "H" shape, an etchant may not be able to be uniformly injected into the lower parts of mold structures spaced apart from the connecting parts and into the lower parts of mold structures adjacent to the connecting parts.

In the nonvolatile memory device according to some embodiments of the present disclosure, the first mold structure MS1 may be completely cut by the first and second block trenches BC11 and BC12. That is, since no connecting parts are formed in the first mold structure MS1, the dispersion at the lower part of the first mold structure MS1 may be improved.

Also, the second mold structure MS2, which is disposed on the first mold structure MS1, may include the first connecting parts CP1 and the second connecting parts CP2, which support and connect the first, second, and third blocks I, II, and III. Accordingly, the leaning of the first, second, and third blocks I, II, and III can be reduced or prevented, and a nonvolatile memory device with improved product reliability can be provided.

Figure 9:
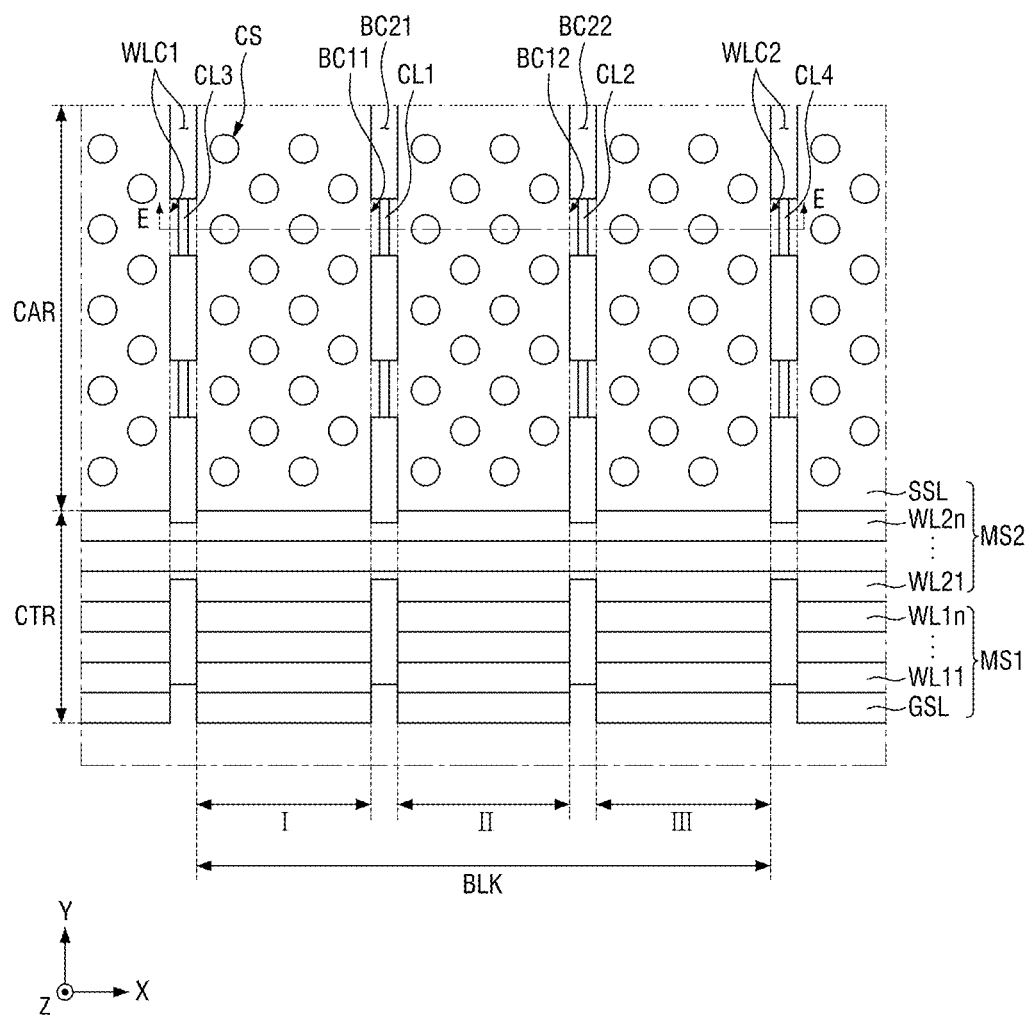
FIG. 9 is a layout view of a nonvolatile memory device according to some embodiments of the present disclosure.
Figure 10:
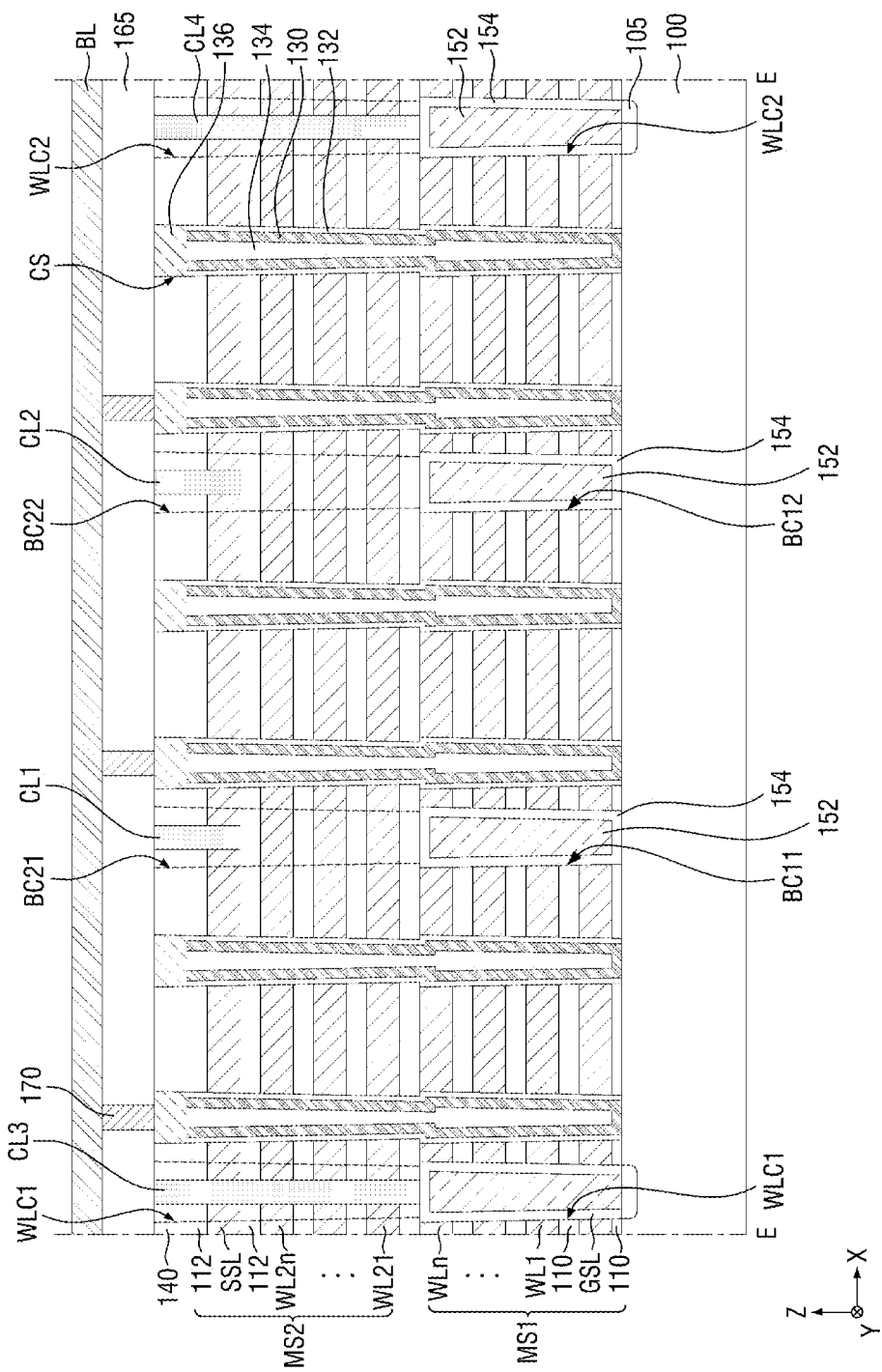
FIG. 10 is a cross-sectional view taken along line E-E of FIG. 9.
Figure 11:
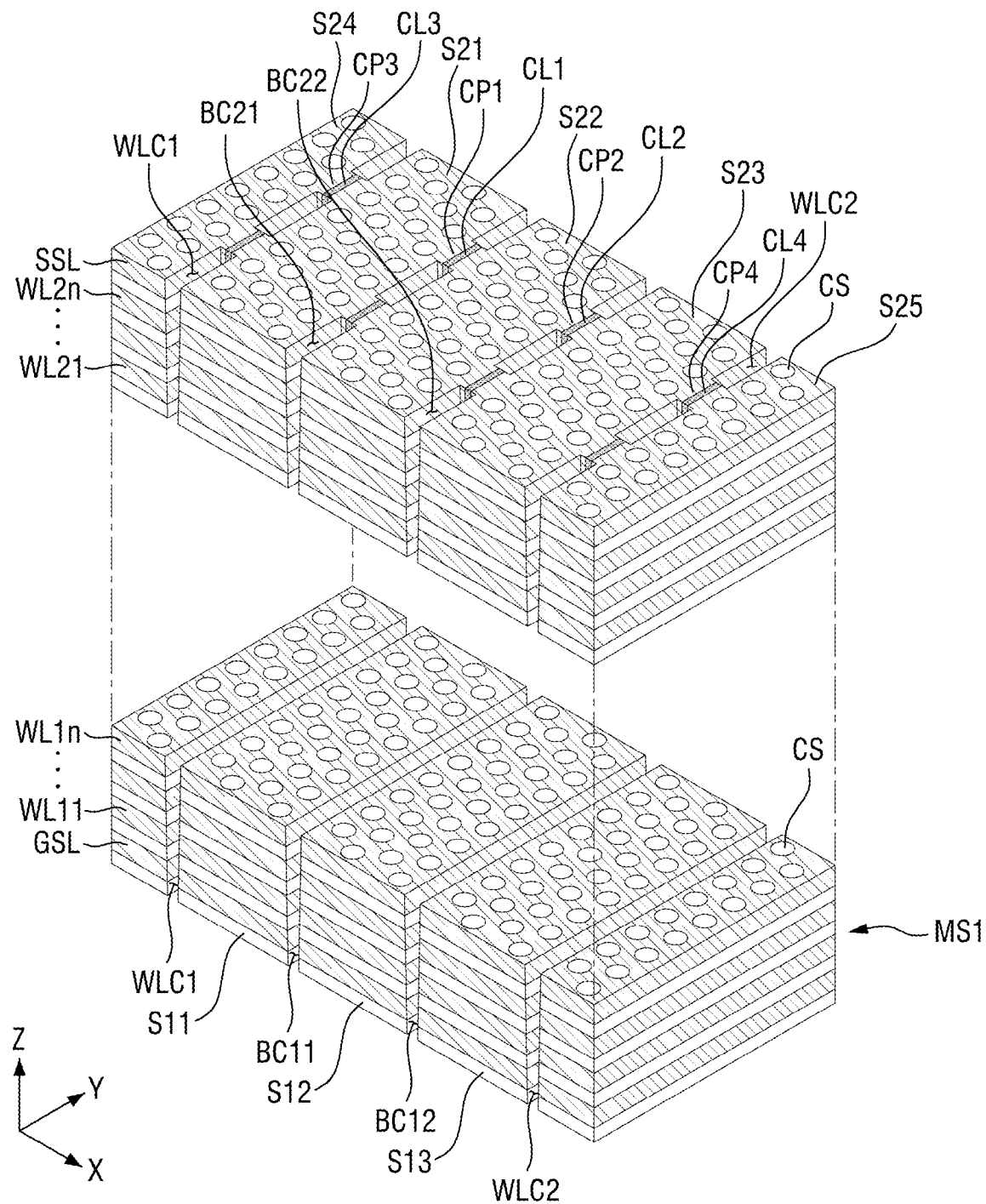
FIG. 11 is a partial exploded perspective view of the nonvolatile memory device of FIG. 9.

FIG. 9 is a layout view of a nonvolatile memory device according to some embodiments of the present disclosure. FIG. 10 is a cross-sectional view taken along line E-E of FIG. 9. FIG. 11 is a partial exploded perspective view of the nonvolatile memory device of FIG. 9. The nonvolatile memory device of FIG. 9 will hereinafter be described, focusing mainly on the differences with the nonvolatile memory device of FIGS. 1 through 8.

Referring to FIGS. 9 through 11, first and second word line trenches WLC1 and WLC2 may cut part of a second mold structure MS2.

Accordingly, the second mold structure MS2 may include a seventh stack S24, which is at least partially connected to a fourth stack S21 by a plurality of third connecting parts CP3. Also, the second mold structure MS2 may include an eighth stack S25, which is at least partially connected to a sixth stack S23 by a plurality of fourth connecting parts CP4. For example, the fourth and seventh stacks S21 and S24 may be connected by the third connecting parts CP3, and the sixth and eighth stacks S23 and S25 may be connected by the fourth connecting parts CP4.

The third connecting parts CP3 may be spaced apart from one another and may be arranged in a second direction Y. That is, the first word line trench WLC1 and the third connecting parts CP3 may be alternately arranged in the second direction Y. The fourth connecting parts CP3 may be spaced apart from one another and may be arranged in the second direction Y. That is, the second word line trench WLC2 and the fourth connecting parts CP4 may be alternately arranged in the second direction Y.

In some embodiments, the bottom surfaces of the third connecting parts CP3 and the bottom surfaces of the fourth connecting parts CP4 may be spaced apart from the top surface of the substrate 100.

In some embodiments, the second mold structure MS2 may further include third and fourth cutting lines CL3 and CL4. The third and fourth cutting lines CL3 and CL4 may cut second gate electrodes (WL21 through WL2$n$ and SSL). For example, as illustrated in FIG. 10, the third and fourth cutting lines CL3 and CL4 may cut the second gate electrodes (WL21 through WL2$n$ and SSL).

In some embodiments, the third cutting line CL3 may be formed in the third connecting parts CP3, and the fourth cutting line CL4 may be formed in the fourth connecting parts CP4. In some embodiments, the width of the third cutting line CL3 may be smaller than the width of the first word line trench WLC1, and the width of the fourth cutting line CL4 may be smaller than the width of the second word line trench WLC2. The term "width", as used herein, means the width in the first direction X. Accordingly, parts of the second gate electrodes (WL21 through WL2$n$ and SSL) may be disposed in the third connecting parts CP3 and the fourth connecting parts CP4.

Figure 12:
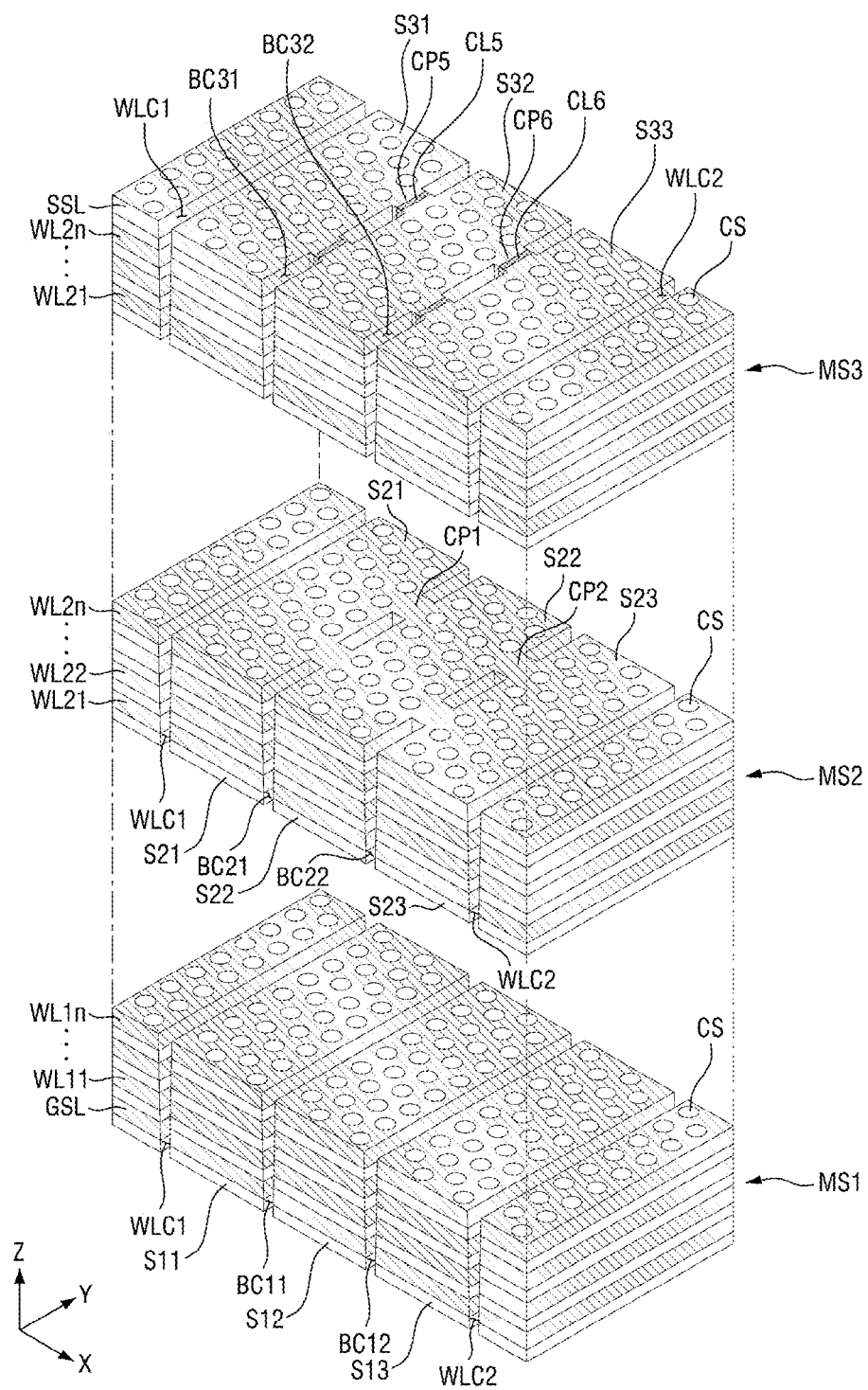
FIG. 12 is a partial exploded perspective view of a nonvolatile memory device according to some embodiments of the present disclosure.

FIG. 12 is a partial exploded perspective view of a nonvolatile memory device according to some embodiments of the present disclosure. The nonvolatile memory device of FIG. 12 will hereinafter be described, focusing mainly on the differences with the nonvolatile memory device of FIGS. 1 through 8.

Referring to FIG. 12, the nonvolatile memory device according to some embodiments of the present disclosure further includes a third mold structure MS3.

The third mold structure MS3 may be formed on a second mold structure MS2. The third mold structure MS3 may include a plurality of third gate electrodes (WL31 through WL3$n$ and SSL) and a plurality of third insulating patterns 114, which are alternately stacked on the second mold structure MS2. A plurality of channel structures CS may penetrate a first mold structure MS1, the second mold structure MS2, and the third mold structure MS3.

In some embodiments, the third gate electrodes (WL31 through WL3$n$ and SSL) may include a plurality of third word lines WL31 through WL3$n$ and a string selection line SSL, and the third word lines WL31 through WL3$n$ and the string selection line SSL are sequentially stacked on the second mold structure MS2. In some embodiments, the string selection line SSL may be the uppermost gate electrode among the third gate electrodes (WL31 through WL3$n$ and SSL).

In some embodiments, the second mold structure MS2 may not include a string selection line SSL. For example, the second mold structure MS2 may include a plurality of second gate electrodes, particularly, a plurality of second word lines WL21 through WL2n, which are sequentially stacked on the first mold structure MS1. In some embodiments, the second mold structure MS2 may not include first and second cutting lines CL1 and CL2.

In some embodiments, first and second word line trenches WLC1 and WLC2 may completely cut the third mold structure MS3.

The third mold structure MS3 may also be cut by fifth block trenches BC31 and sixth block trenches BC32. The fifth block trenches BC31 and the sixth block trenches BC32 may be interposed between the first and second word line trenches WLC1 and WLC2.

In some embodiments, the third mold structure MS3 may include a plurality of fifth block trenches BC31 and a plurality of sixth block trenches BC32, and the fifth block trenches BC31 and the sixth block trenches BC32 cut the third mold structure MS3. The fifth block trenches BC31 and the sixth block trenches BC32 may partially cut the third mold structure MS3.

Accordingly, the third mold structure MS3, which is between the first and second word line trenches WLC1 and WLC2, may further include a plurality of ninth, tenth, and eleventh stacks S31, S32, and S33, which are at least partially connected by a plurality of fifth connecting parts CP5 and a plurality of sixth connecting parts CP6. For example, the ninth and tenth stacks S31 and S32 may be connected by the fifth connecting parts CP5, and the tenth and eleventh stacks S32 and S33 may be connected by the sixth connecting parts CP6.

The fifth connecting parts CP5 may overlap with third connecting parts CP3 in a third direction Z, and the sixth connecting parts CP6 may overlap with fourth connecting parts CP4 in the third direction Z. However, the present disclosure is not limited to this. Alternatively, the fifth connecting parts CP5 may not overlap with the third connecting parts CP3 in the third direction Z, and the sixth connecting parts CP6 may not overlap with the fourth connecting parts CP4 in the third direction Z.

In some embodiments, the third mold structure MS3 may further include fifth and sixth cutting lines CL5 and CL6. The fifth and sixth cutting lines CL5 and CL6 may be interposed between the first and second word line trenches WLC1 and WLC2. The fifth and sixth cutting lines CL5 and CL6 may extend in a second direction Y to cut the string selection line SSL.

In some embodiments, the fifth cutting line CL5 may be formed in the fifth connecting parts CP5, and the sixth cutting line CL6 may be formed in the sixth connecting parts CP6.

Figure 13:
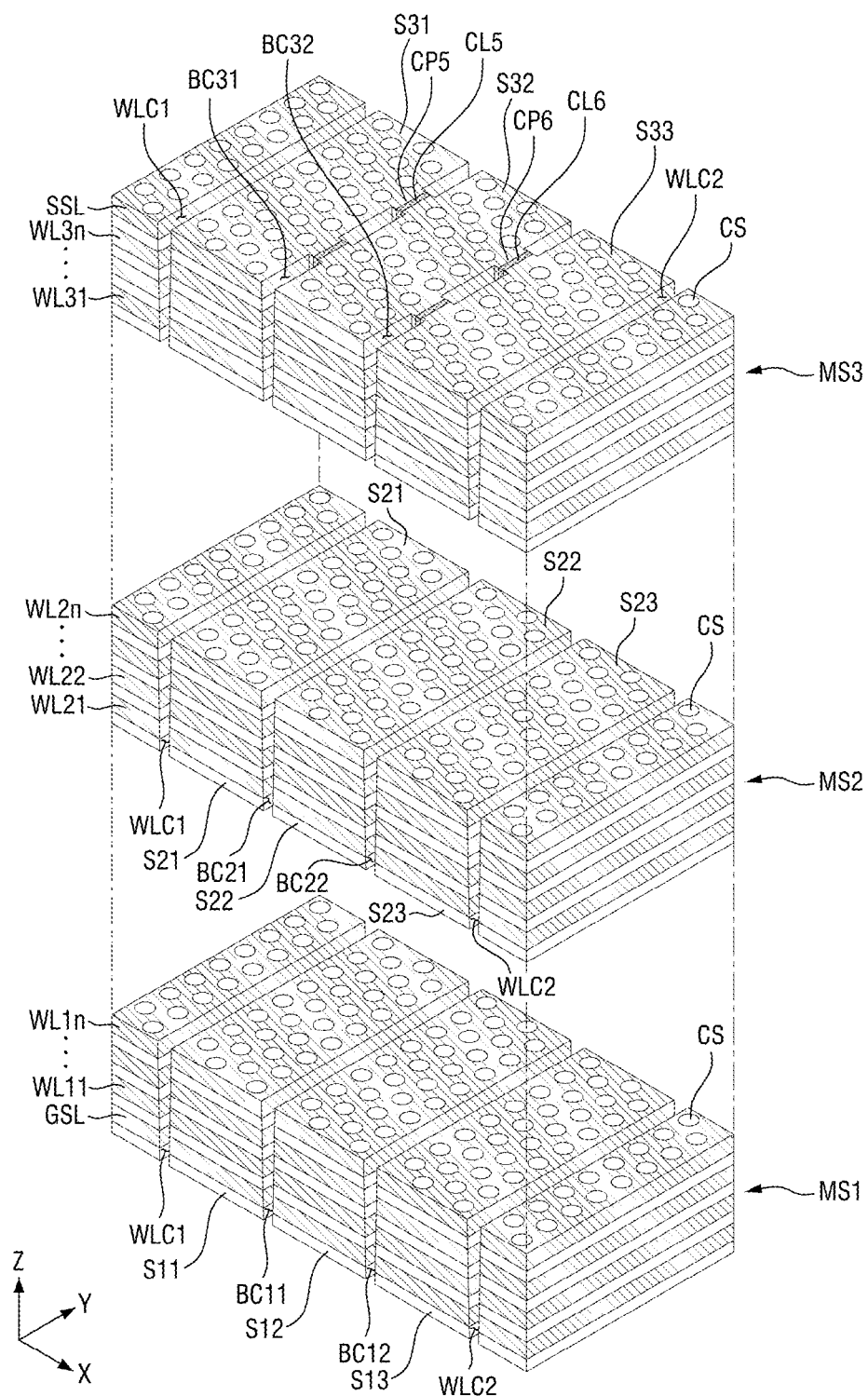
FIG. 13 is a partial exploded perspective view of a nonvolatile memory device according to some embodiments of the present disclosure.

FIG. 13 is a partial exploded perspective view of a nonvolatile memory device according to some embodiments of the present disclosure. The nonvolatile memory device of FIG. 13 will hereinafter be described, focusing mainly on the differences with the nonvolatile memory devices of FIGS. 1 through 12.

Referring to FIG. 13, third block trenches BC21 and fourth block trenches BC22 completely cut a second mold structure MS2.

For example, the third block trenches BC21 may extend in a second direction Y to completely cut the second mold structure MS2, and the fourth block trenches BC22 may be spaced apart in a first direction X from the third block trenches BC21 and may extend in the second direction Y to completely cut the second mold structure MS2.

Accordingly, a fourth stack S21 and a fifth stack S22 can be separated from each other by the third block trenches BC21, and the fifth stack S22 and a sixth stack S23 can be separated from each other by the fourth block trenches BC22.

Figure 14:
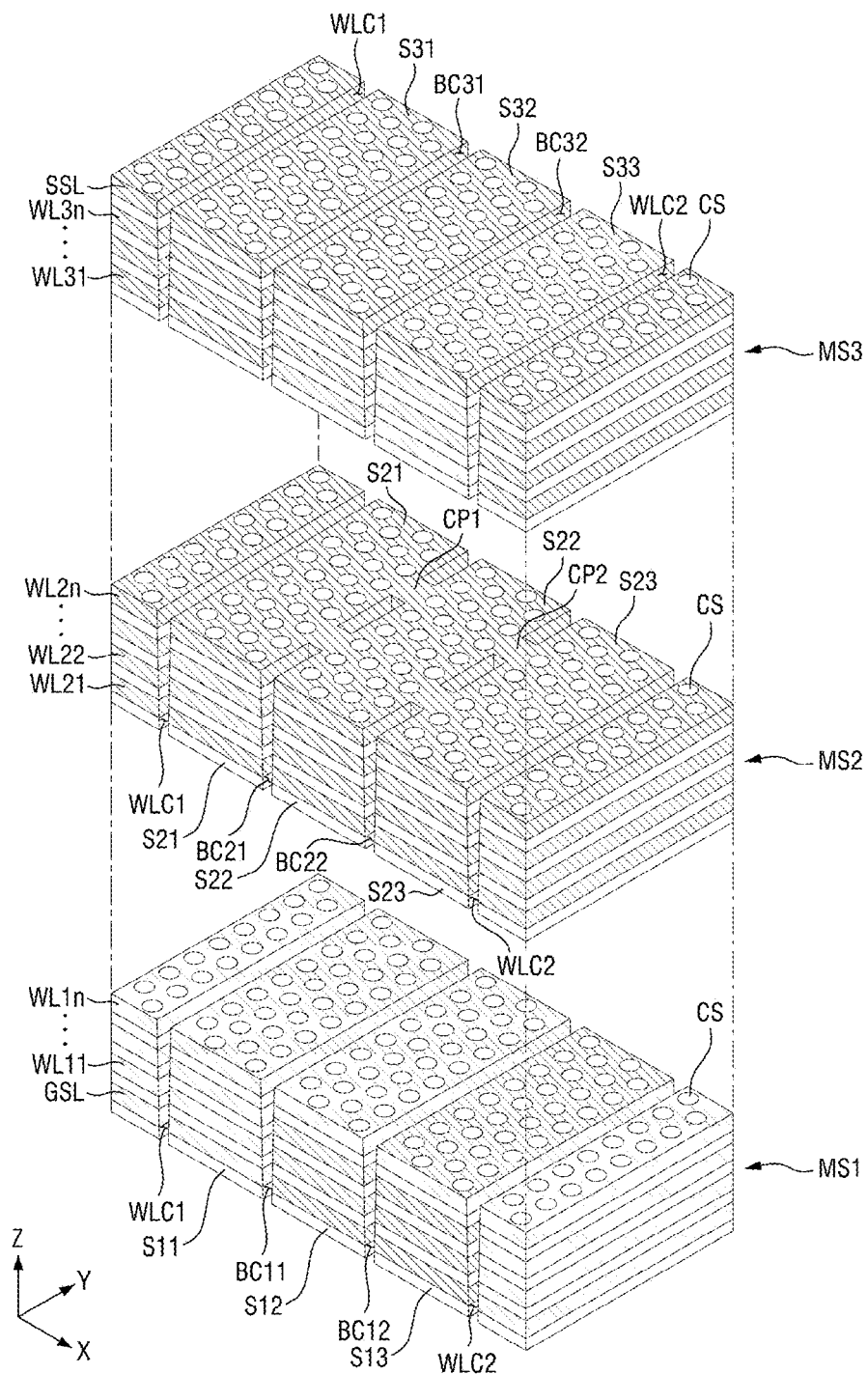
FIG. 14 is a partial exploded perspective view of a nonvolatile memory device according to some embodiments of the present disclosure.

FIG. 14 is a partial exploded perspective view of a nonvolatile memory device according to some embodiments of the present disclosure. The nonvolatile memory device of FIG. 14 will hereinafter be described, focusing mainly on the differences with the nonvolatile memory devices of FIGS. 1 through 12.

Referring to FIG. 14, fifth block trenches BC31 and sixth block trenches BC32 completely cut a third mold structure MS3.

For example, the fifth block trenches BC31 may extend in a second direction Y to completely cut the third mold structure MS3, and the sixth block trenches BC32 may be spaced apart in a first direction X from the fifth block trenches BC31 and may extend in a second direction Y to completely cut the third mold structure MS3.

Accordingly, a ninth stack S31 and a tenth stack S32 can be separated from each other by the fifth block trenches BC31, and the tenth stack S32 and an eleventh stack S33 can be separated from each other by the sixth block trenches BC32.

Figure 15:
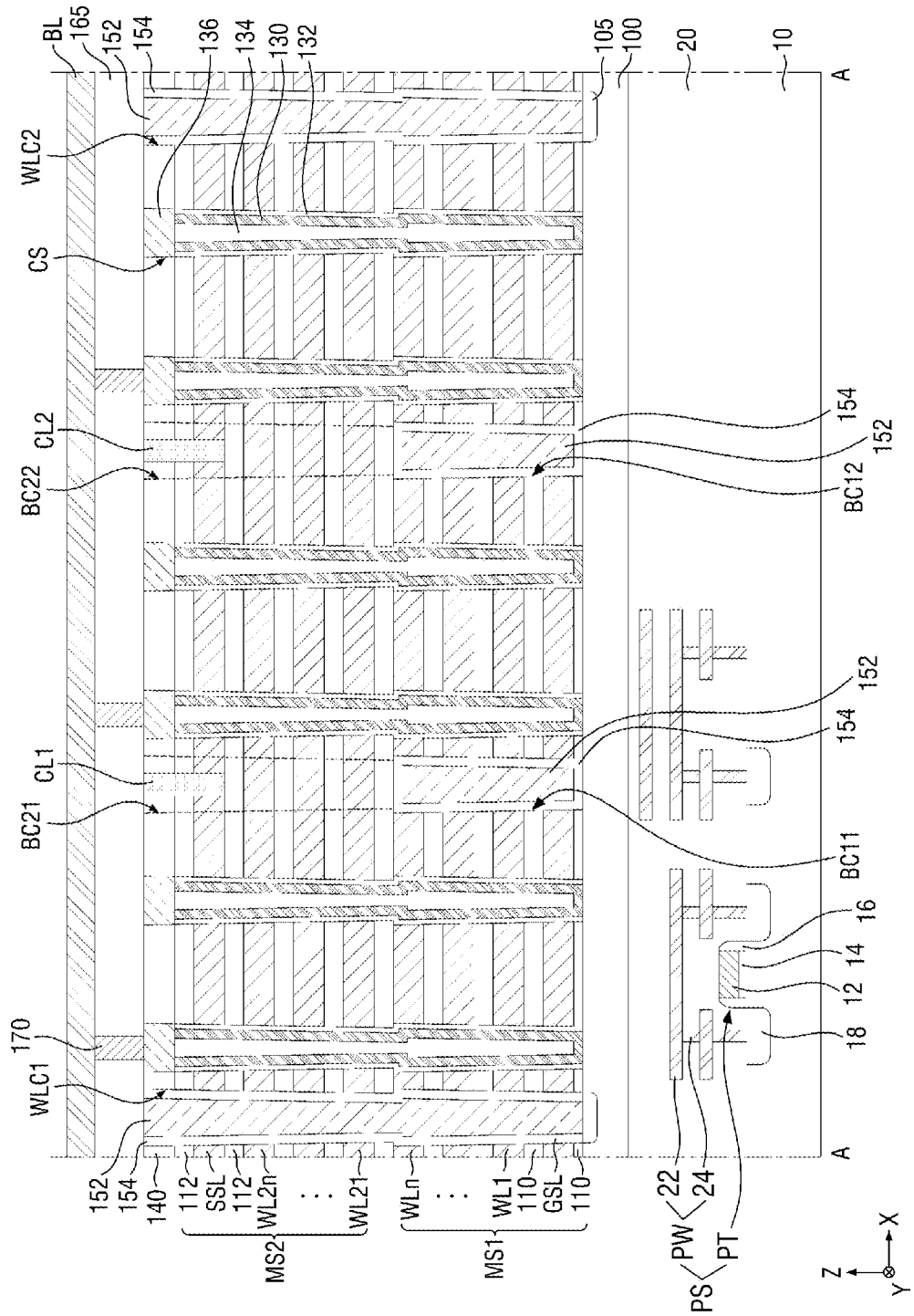
FIG. 15 is a partial exploded perspective view of a nonvolatile memory device according to some embodiments of the present disclosure.

FIG. 15 is a partial exploded perspective view of a nonvolatile memory device according to some embodiments of the present disclosure. The nonvolatile memory device of FIG. 15 will hereinafter be described, focusing mainly on the differences with the nonvolatile memory device of FIGS. 1 through 8. Specifically, FIG. 15 is a cross-sectional view taken along line A-A of FIG. 2.

Referring to FIG. 15, the nonvolatile memory device according to some embodiments of the present disclosure further includes a base substrate 10 and a peripheral circuit structure PS.

The base substrate 10 may include a semiconductor substrate such as, for example, a silicon substrate, a germanium substrate, or a silicon-germanium substrate, or may include an SOI substrate or a GOI substrate.

The peripheral circuit structure PS may be formed on the base substrate 10. The peripheral circuit structure PS may form a peripheral circuit that controls an operation of each memory cell. For example, the peripheral circuit structure PS may include a row decoder, a column decoder, a page buffer, and a control circuit. For example, as illustrated in FIG. 15, the peripheral circuit structure PS may include a peripheral circuit element PT and a wire structure PW.

In some embodiments, the peripheral circuit element PT may include a transistor. For example, the peripheral circuit element PT may include a peripheral circuit gate electrode 12, a peripheral circuit gate insulating film 14, gate spacers 16, and/or source/drain regions 18.

In some embodiments, the peripheral circuit element PT may be a high-voltage transistor, but the present disclosure is not limited thereto. Examples of the peripheral circuit element PT may include various active elements such as a transistor and various passive elements such as a capacitor, a resistor, or an inductor.

In some embodiments, a third interlayer insulating film 20 may be formed on the base substrate 10. The third interlayer insulating film 20 may be formed to cover the peripheral circuit element PT on the base substrate 10. The third interlayer insulating film 20 is illustrated as being a single-layer film, but the present disclosure is not limited thereto. Alternatively, the third interlayer insulating film 20 may be a multilayer film in which a plurality of insulating films are stacked. The third interlayer insulating film 20 may include, for example, silicon oxide, but the present disclosure is not limited thereto.

The wire structure PW may include peripheral circuit wires 22 and peripheral circuit contacts 24. The peripheral circuit wires 22 and the peripheral circuit contacts 24 may be formed in, for example, the third interlayer insulating film 20. The peripheral circuit wires 22 may be connected to the peripheral circuit element PT via the peripheral circuit contacts 24.

The peripheral circuit wires 22 may include, for example, a metal (e.g., copper (Cu) or aluminum (Al)), but the present disclosure is not limited thereto. The peripheral circuit contacts 24 may include, for example, silicon (e.g., polysilicon) or a metal (e.g., W or Cu), but the present disclosure is not limited thereto.

Figure 16:
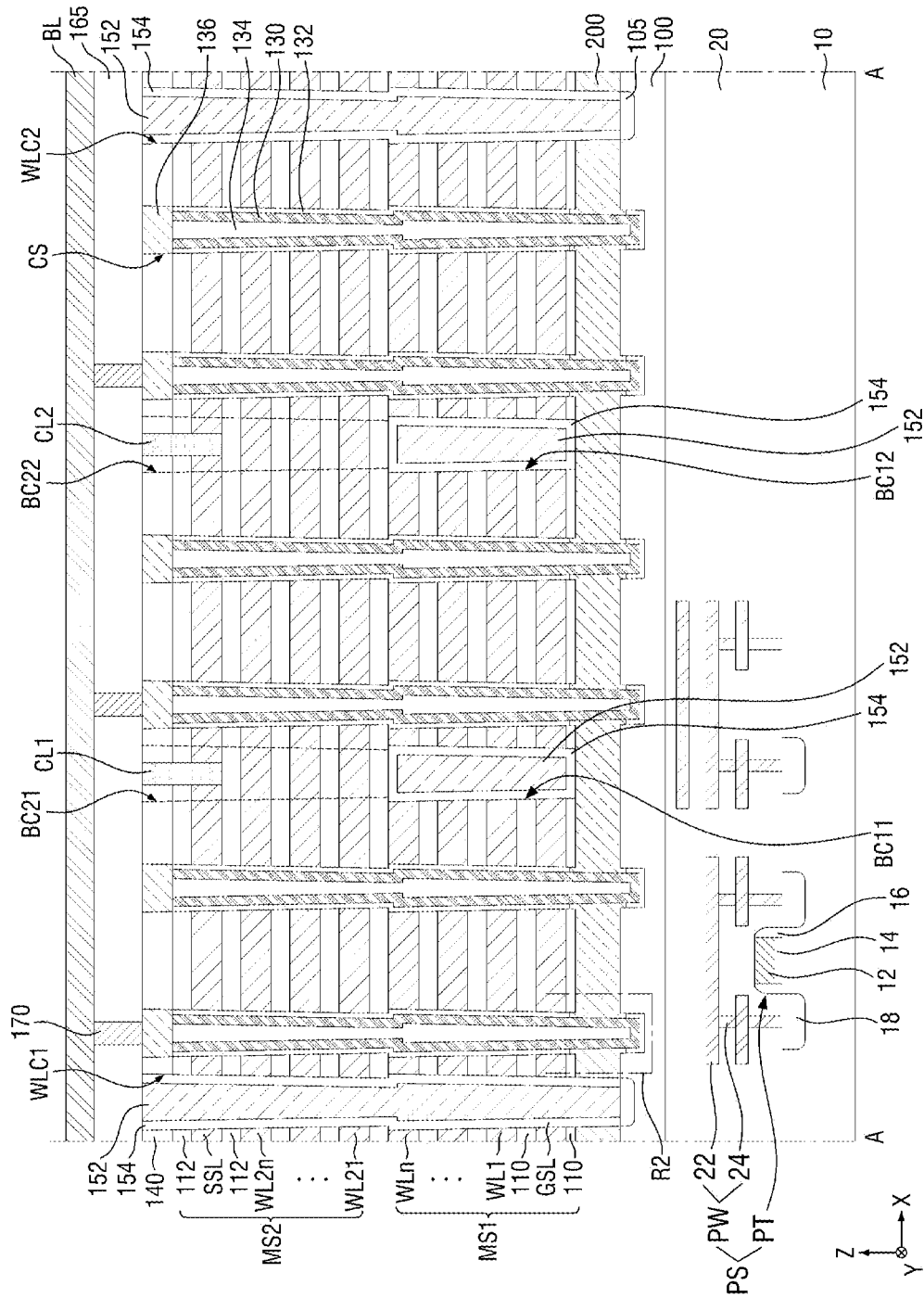
FIG. 16 is a cross-sectional view of a nonvolatile memory device according to some embodiments of the present disclosure.
Figure 17:
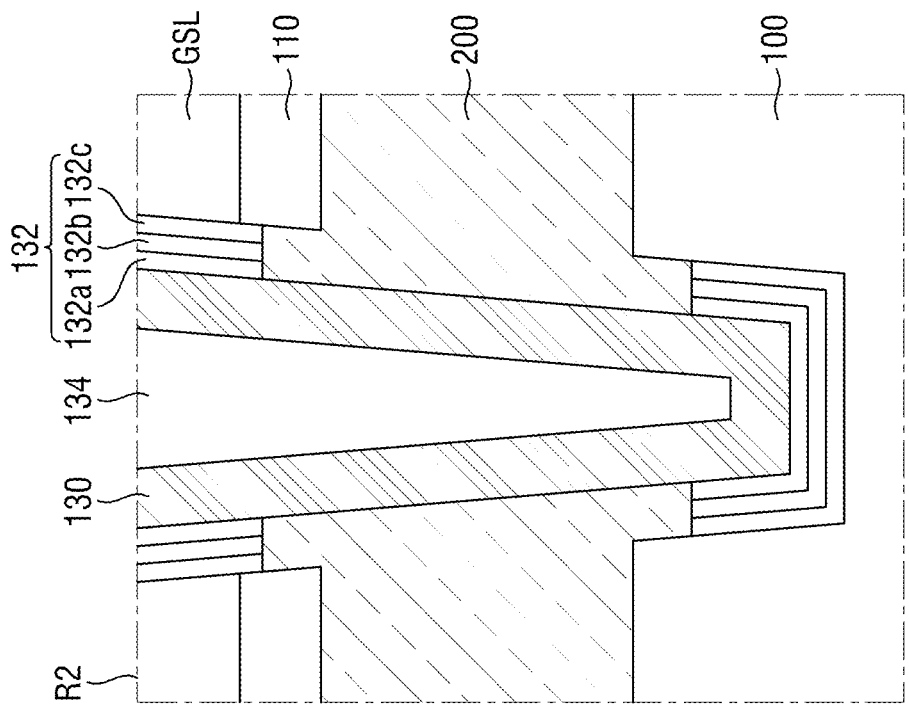
FIG. 17 is an enlarged cross-sectional view illustrating part R2 of FIG. 16.

FIG. 16 is a cross-sectional view of a nonvolatile memory device according to some embodiments of the present disclosure. FIG. 17 is an enlarged cross-sectional view illustrating part R2 of FIG. 16. The nonvolatile memory device of FIGS. 16 and 17 will hereinafter be described, focusing mainly on the differences with the nonvolatile memory devices of FIGS. 1 through 15. Specifically, FIG. 16 is a cross-sectional view taken along line A-A of FIG. 2.

Referring to FIGS. 16 and 17, the nonvolatile memory device according to some embodiments of the present disclosure further includes a source structure 200.

The source structure 200 may be formed on a substrate 100. In some embodiments, the source structure 200 may be interposed between the substrate 100 and a first mold structure MS1. The source structure 200 may include a conductive material. For example, the source structure 200 may include a metal or polysilicon doped with impurities.

In some embodiments, channel structures CS may be connected to the substrate 100 through the source structure 200. For example, as illustrated in FIG. 17, the substrate 100 may include substrate trenches ST. Lower parts of the channel structures CS may fill the substrate trenches ST. In some embodiments, information storage films 132 of the channel structure CS may extend along the sides and the bottoms of the substrate trenches ST.

In some embodiments, the source structure 200 may be formed to be connected to semiconductor patterns 130 of the channel structures CS. For example, the source structure 200 may be connected to the semiconductor patterns 130 through parts of the information storage films 132.

In some embodiments, parts of the source structure 200 that are adjacent to the semiconductor patterns 130 may protrude toward the information storage films 132. For example, the length by which the source structure 200 extends in the third direction Z may become greater in regions where the source structure 200 is adjacent to the semiconductor patterns 130 because of the characteristics of etching for removing parts of the information storage films 132 to form the source structure 200.

A method of fabricating a nonvolatile memory device according to some embodiments of the present disclosure will hereinafter be described with reference to FIGS. 1 through 30.

FIGS. 18 through 26 illustrate steps of a method of fabricating a nonvolatile memory device according to some embodiments of the present disclosure. For convenience, descriptions of features of the method of fabricating a nonvolatile memory device according to some embodiments of the present disclosure that have already been described above with reference to FIGS. 1 through 8 will be omitted or at least simplified. Specifically, FIGS. 18 through 26 are partial exploded perspective views illustrating the method of fabricating a nonvolatile memory device according to some embodiments of the present disclosure.

Figure 18:
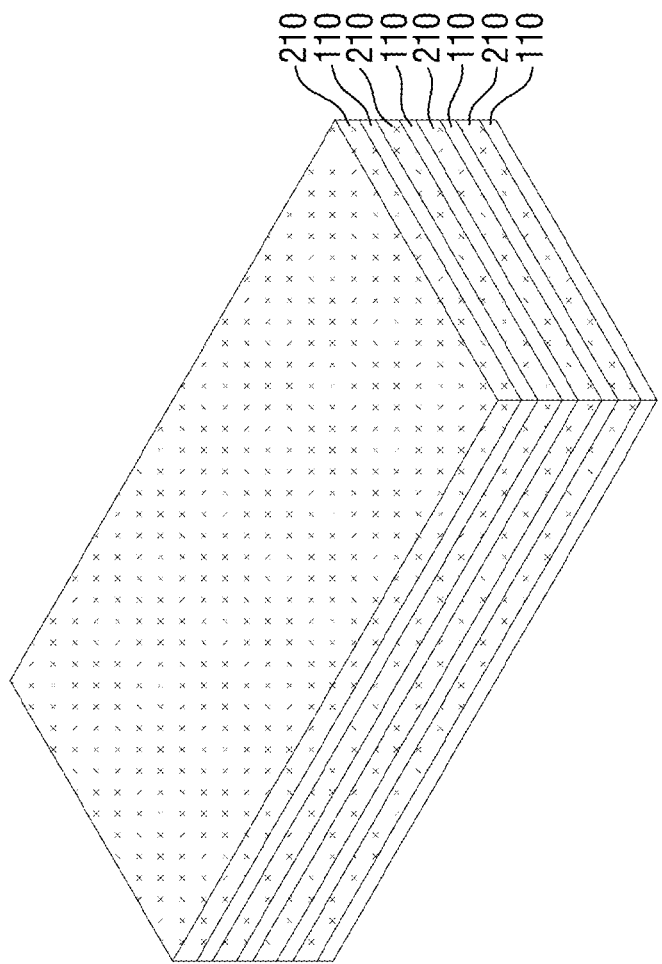
FIGS. 18 through 26 illustrate steps of a method of fabricating a nonvolatile memory device according to some embodiments of the present disclosure.

Referring to FIG. 18, a plurality of first sacrificial patterns 210 and a plurality of first insulating patterns 110 are formed.

The first sacrificial patterns 210 and the first insulating patterns 110 may be alternately stacked in a third direction Z. The first sacrificial patterns 210 may include a material having etching selectivity with respect to the first insulating patterns 110. For example, in a case where the first insulating patterns 110 include silicon oxide, the first sacrificial patterns 210 may include polysilicon.

Figure 19:
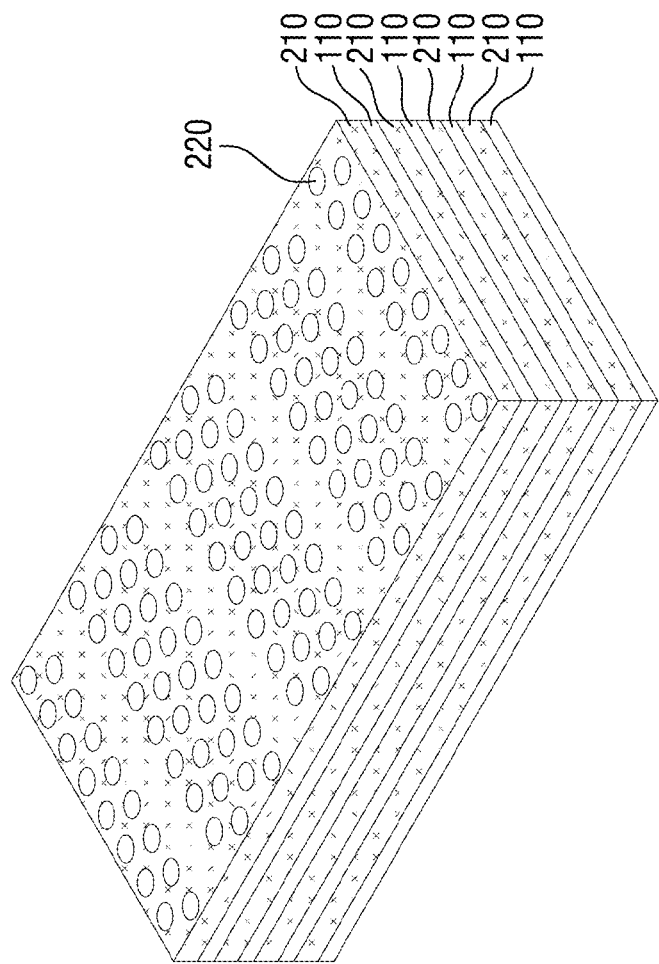

Referring to FIG. 19, a plurality of sacrificial channels 220 that penetrate the first sacrificial patterns 210 and the first insulating patterns 110 are formed.

For example, a plurality of first through holes that extend in the first direction Z through the first sacrificial patterns 210 and the first insulating patterns 110 may be formed. Thereafter, a plurality of sacrificial channels 220 that fill the first through holes may be formed. The sacrificial channels 220 may include a material having etching selectivity with respect to the first sacrificial patterns 210 and the first insulating patterns 110.

Figure 20:
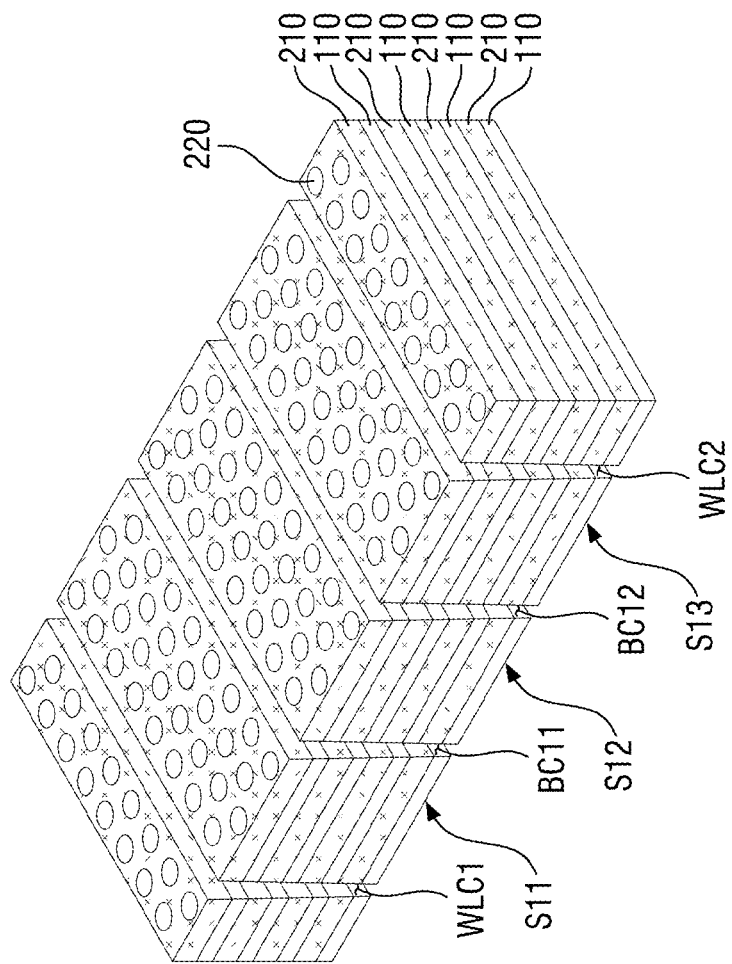

Referring to FIG. 20, first and second word line trenches WLC1 and WLC2 and first and second block trenches BC11 and BC12 are formed to cut the first sacrificial patterns 210 and the first insulating patterns 110.

The first and second word line trenches WLC1 and WLC2 and the first and second block trenches BC11 and BC12 may cut the first sacrificial patterns 210 and the first insulating patterns 110. In some embodiments, the first and second word line trenches WLC1 and WLC2 and the first and second block trenches BC11 and BC12 may extend in a second direction Y to completely cut the first sacrificial patterns 210 and the first insulating patterns 110.

Accordingly, the first sacrificial patterns 210 and the first insulating patterns 110 may form first, second, and third stacks S11, S12, and S13, which are separated from one another by the first and second block trenches BC11 and BC12.

Figure 21:
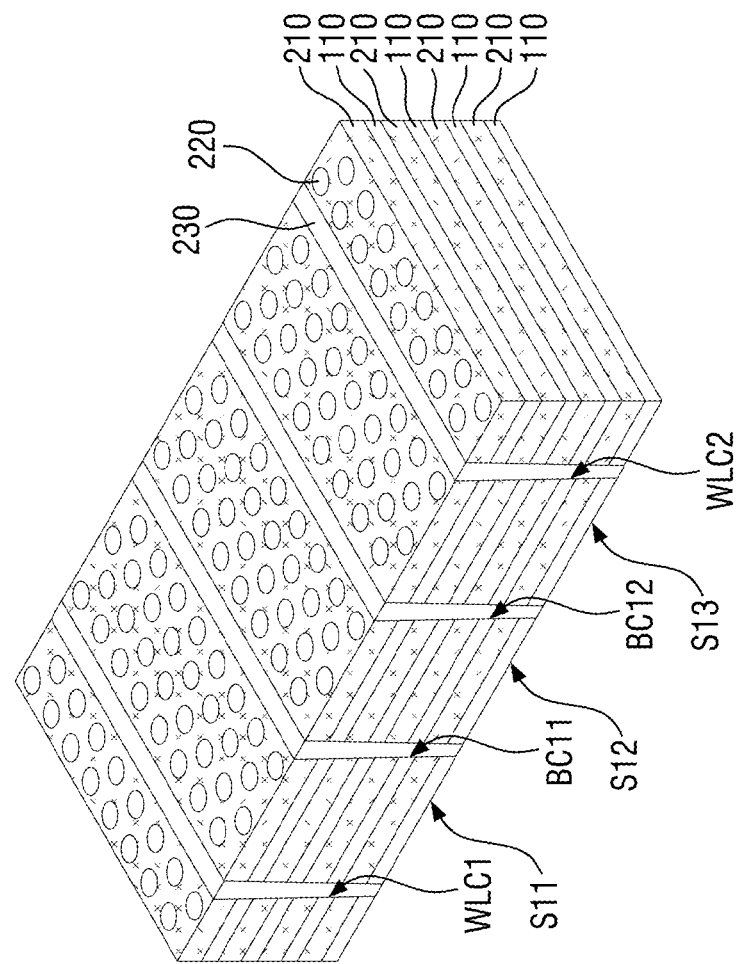

Referring to FIG. 21, a plurality of sacrificial filling patterns 230 are formed in the first and second word line trenches WLC1 and WLC2 and the first and second block trenches BC11 and BC12.

The sacrificial filling patterns 230 may be formed to fill the first and second word line trenches WLC1 and WLC2 and the first and second block trenches BC11 and BC12. The sacrificial filling patterns 230 may include a material having etching selectivity with respect to the first sacrificial patterns 210 and the first insulating patterns 110.

Figure 22:
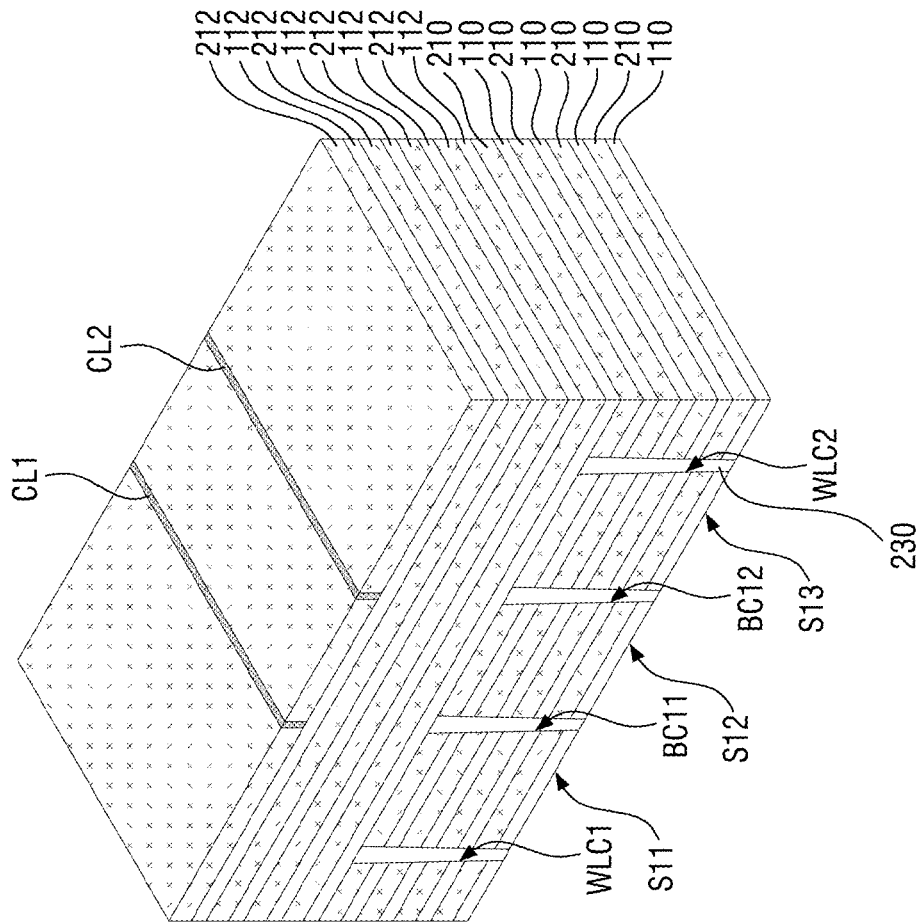

Referring to FIG. 22, a plurality of second sacrificial patterns 212 and a plurality of second insulating patterns 112 are formed on the first sacrificial patterns 210 and the first insulating patterns 110.

The second sacrificial patterns 212 and the second insulating patterns 112 may be alternately stacked in the third direction Z. The second sacrificial patterns 212 may include a material having etching selectivity with respect to the second insulating patterns 112. For example, in a case where the second insulating patterns 112 include silicon oxide, the second sacrificial patterns 212 may include polysilicon.

In some embodiments, the second sacrificial patterns 212 may include the same material as the first sacrificial patterns 210, and the second insulating patterns 112 may include the same material as the first insulating patterns 110.

In some embodiments, first and second cutting lines CL1 and CL2 may be further formed.

The first and second cutting lines CL1 and CL2 may cut the uppermost second sacrificial pattern 212 among the second sacrificial patterns 212. For example, the first cutting line CL1 may extend in the second direction Y to cut the uppermost second sacrificial pattern 212, and the second cutting line CL2 may be spaced apart in a first direction X from the first cutting line CL1 and may extend in the second direction Y to cut the uppermost second sacrificial pattern 212.

In some embodiments, the first cutting line CL1 may be formed to overlap with the first block trench BC11 in the third direction Z, and the second cutting line CL2 may be formed to overlap with the second block trench BC12 in the third direction Z.

Figure 23:
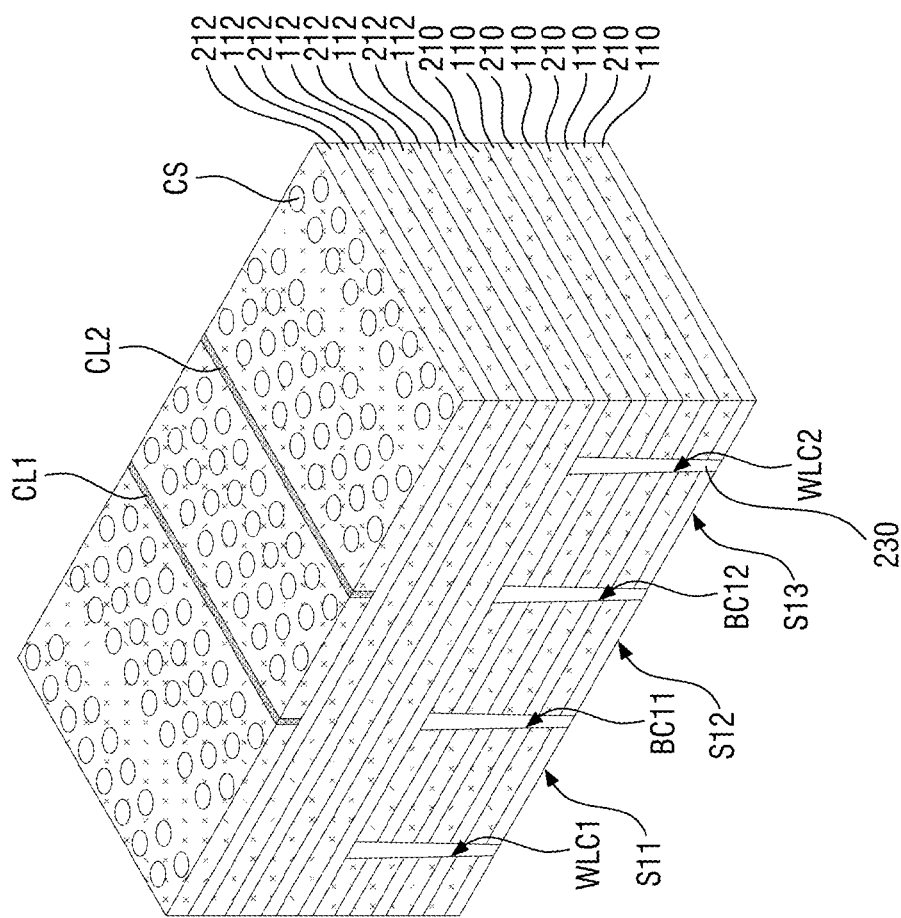

Referring to FIG. 23, a plurality of channel structures CS that penetrate the first sacrificial patterns 210, the first insulating patterns 110, the second sacrificial patterns 212, and the second insulating patterns 112 are formed.

For example, a plurality of second through holes that extend in the third direction Z through the second sacrificial patterns 212 and the second insulating patterns 112 may be formed. The second through holes may be formed to expose the sacrificial channels 220 of FIG. 21. Thereafter, the sacrificial channels 220 exposed by the second through holes may be removed. Thereafter, channel structures CS that fill the first through holes and the second through holes may be formed.

The first through holes and the second through holes have been described as above as being formed separately, but the present disclosure is not limited thereto. In some embodiments, the formation of the sacrificial channels 220 may not be performed. Obviously, through holes that penetrate the first sacrificial patterns 210, the first insulating patterns 110, the second sacrificial patterns 212, and the second insulating patterns 112 may also be formed.

Figure 24:
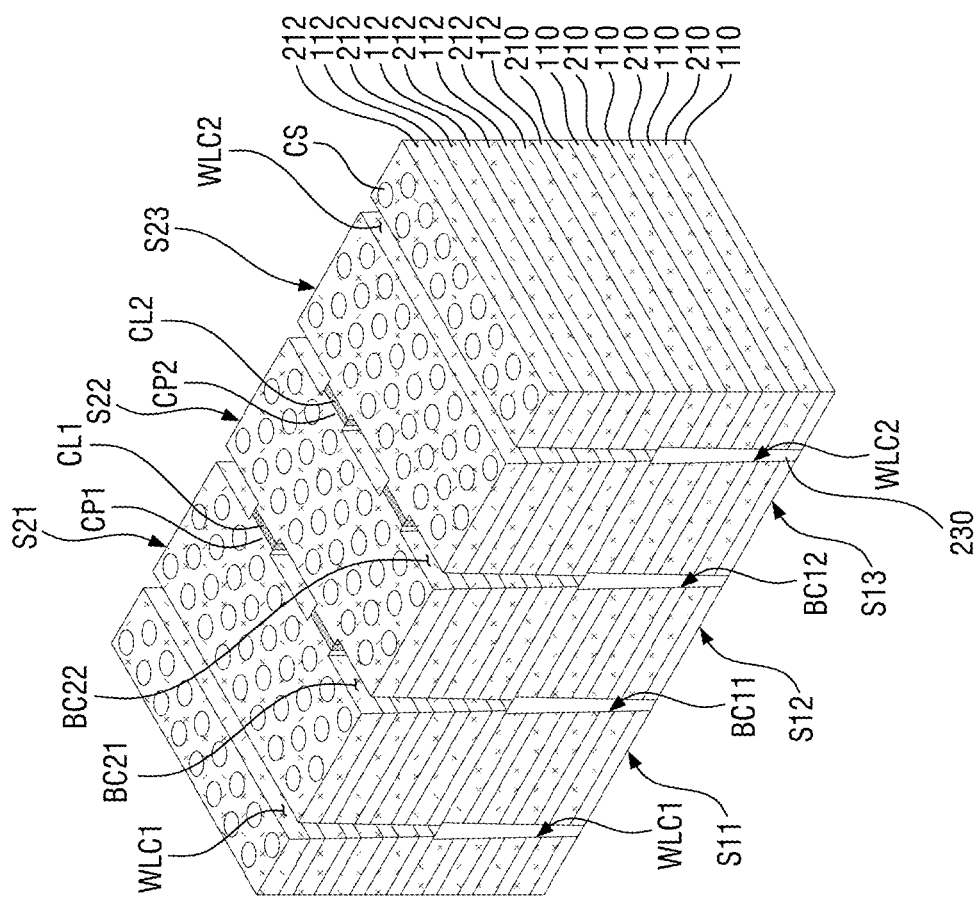

Referring to FIG. 24, first and second word line trenches WLC1 and WLC2, a plurality of third block trenches BC21 and a plurality of fourth block trenches BC22 are formed to cut the second sacrificial patterns 212 and the second insulating patterns 112.

In some embodiments, the first and second word line trenches WLC1 and WLC2 may extend in the second direction Y to completely cut the second sacrificial patterns 212 and the second insulating patterns 112.

In some embodiments, the third block trenches BC21 and the fourth block trenches BC22 may partially cut the second sacrificial patterns 212 and the second insulating patterns 112. For example, the third block trenches may be spaced apart from one another and may be arranged in the second direction Y, and the fourth block trenches BC22 may be spaced apart in the first direction X from the third block trenches BC21 and from one another and may be arranged in the second direction Y.

Accordingly, the second sacrificial patterns 212 and the second insulating patterns 112 may form fourth, fifth, and sixth stacks S21, S22, and S23, which are at least partially connected by first connecting parts CP1 and second connecting parts CP2.

In some embodiments, the third block trenches BC21 and the first connecting parts CP1 may overlap with the first block trenches BC11 in the third direction Z, and the fourth block trenches BC22 and the second connecting parts CP2 may overlap with the second block trenches BC12 in the third direction Z. Accordingly, the first cutting line CL1 may be formed in the first connecting parts CP1, and the second cutting line CL2 may be formed in the second connecting parts CP2.

Figure 25:
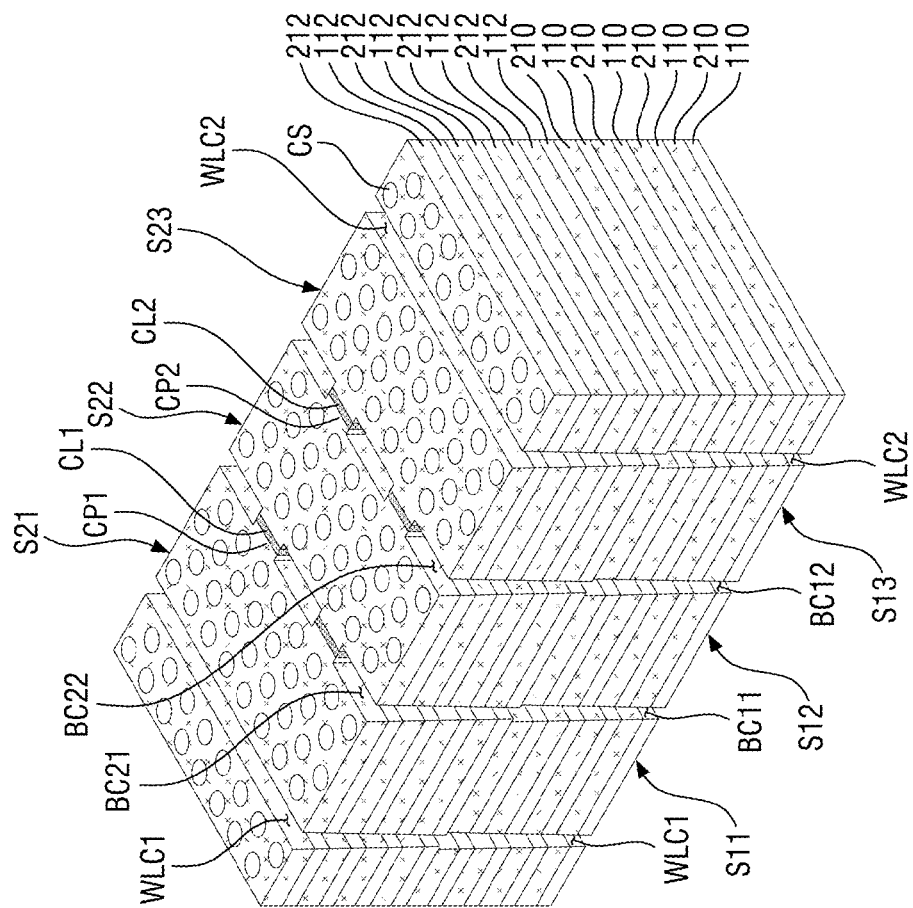

Referring to FIG. 25, the sacrificial filling patterns 230 are removed.

As a result, the first and second word line trenches WLC1 and WLC2, the first block trenches BC11, and the second block trenches BC12 may partially expose the first sacrificial patterns 210.

Figure 26:
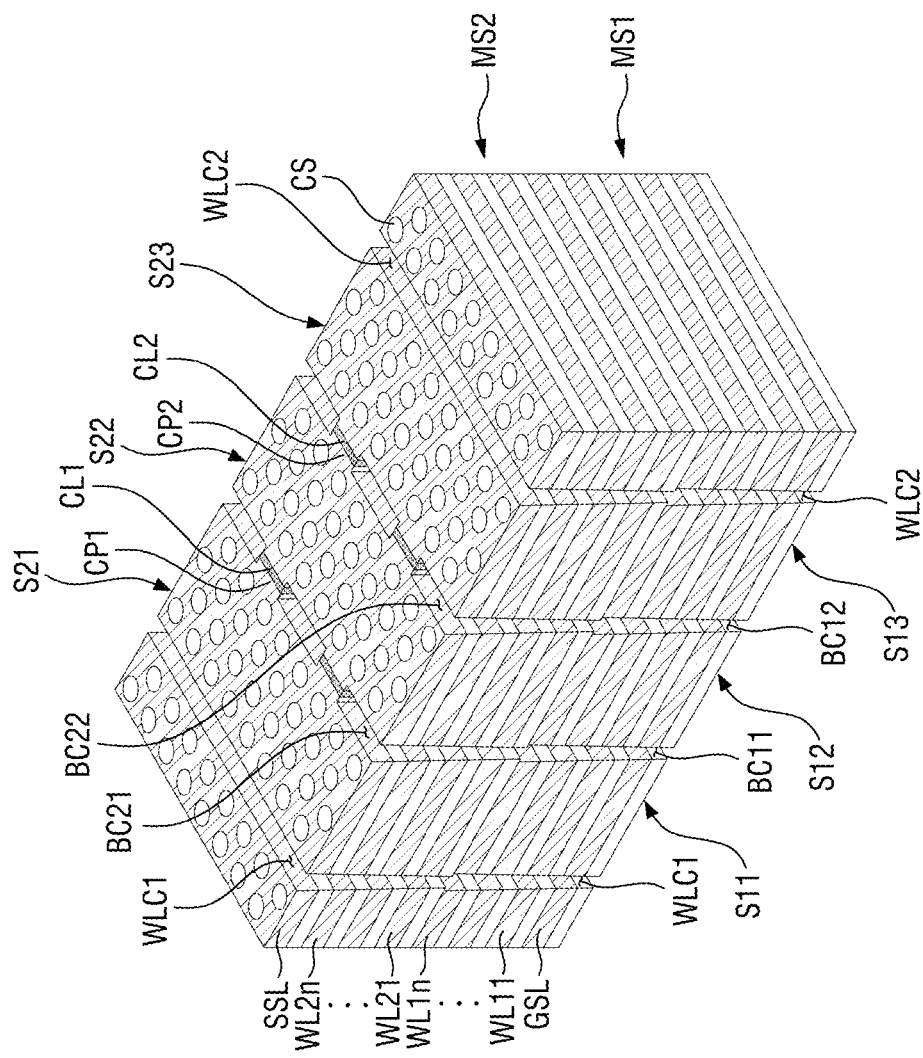

Referring to FIG. 26, a plurality of first gate electrodes (GSL and WL11 through WL1n) and a plurality of second gate electrodes (WL21 through WL2n and SSL) are formed.

The first gate electrodes (GSL and WL11 through WL1n) may be formed in regions where the first sacrificial patterns 210 are removed. That is, the first sacrificial patterns 210 may be replaced with the first gate electrodes (GSL and WL11 through WL1n).

The second gate electrodes (WL21 through WL2n and SSL) may be formed in regions where the second sacrificial patterns 212 are removed. That is, the second sacrificial patterns 212 may be replaced with the second gate electrodes (WL21 through WL2n and SSL).

Accordingly, the first and second mold structures MS1 and MS2 of FIG. 8 can be formed.

FIGS. 27 through 30 illustrate steps of a method of fabricating a nonvolatile memory device according to some embodiments of the present disclosure. For convenience, descriptions of features of the method of fabricating a nonvolatile memory device according to some embodiments of the present disclosure that have already been described above with reference to FIGS. 18 through 26 will be omitted or at least simplified. Specifically, FIGS. 27 through 30 are partial exploded perspective views illustrating the method of fabricating a nonvolatile memory device according to some embodiments of the present disclosure, particularly, steps that follow the step illustrated in FIG. 23.

Figure 27:
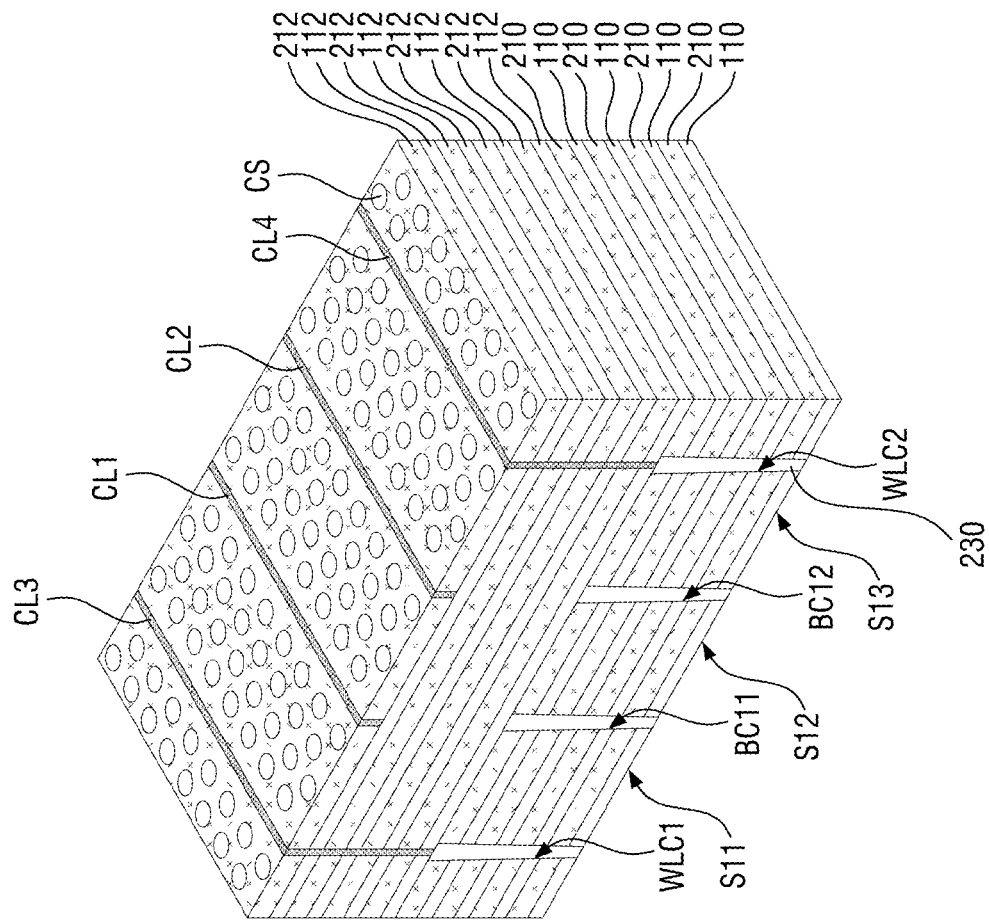
FIGS. 27 through 30 illustrate steps of a method of fabricating a nonvolatile memory device according to some embodiments of the present disclosure.

Referring to FIG. 27, third and fourth cutting lines CL3 and CL4 are formed.

The third and fourth cutting lines CL3 and CL4 may cut a plurality of second sacrificial patterns 212. For example, the third and fourth cutting lines CL3 and CL4 may extend in a second direction Y to cut the second sacrificial patterns 212.

In some embodiments, the third cutting line CL3 may be formed to overlap with a first word line trench WLC1 in a third direction Z, and the fourth cutting line CL4 may be formed to overlap with a second word line trench WLC2 in the third direction Z.

Figure 28:
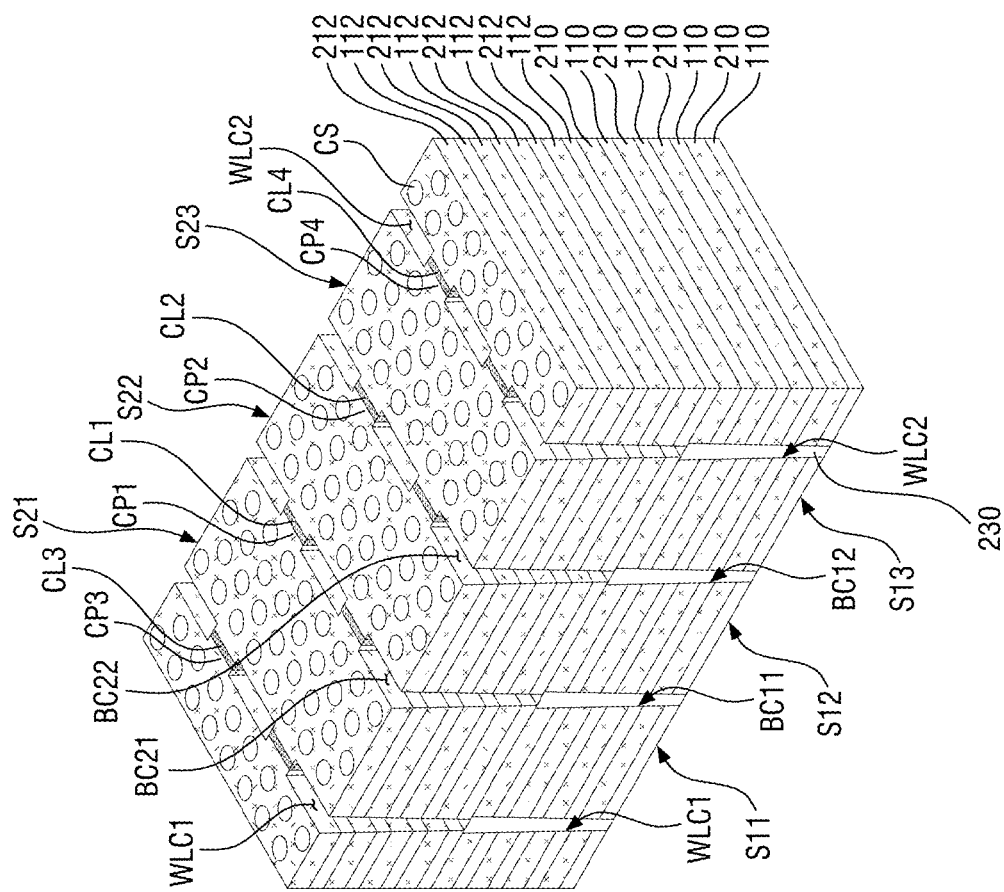

Referring to FIG. 28, a plurality of channel structures CS that penetrate first sacrificial patterns 210, first insulating patterns 110, second sacrificial patterns 212, and second insulating patterns 112 are formed.

The formation of the channel structures CS is almost the same as described above with reference to FIG. 23, and thus, a detailed description thereof will be omitted.

Thereafter, first and second word line trenches WLC1 and WLC2, a plurality of third block trenches BC21, and a plurality of fourth block trenches BC22 are formed to cut second sacrificial patterns 212 and second insulating patterns 112.

In some embodiments, the first and second word line trenches WLC1 and WLC2 may partially cut a second mold structure MS2. Accordingly, the second sacrificial patterns 212 and the second insulating patterns 112 may form a ninth stack S31, which is at last partially connected to a fourth stack S21 by the third connecting parts CP3. Also, the second sacrificial patterns 212 and the second insulating patterns 112 may form a tenth stack S32, which is at last partially connected to a sixth stack S23 by the fourth connecting parts CP4.

In some embodiments, the third cutting line CL3 may be formed in the third connecting parts CP3, and the fourth cutting line CL4 may be formed in the fourth connecting parts CP4.

Figure 29:
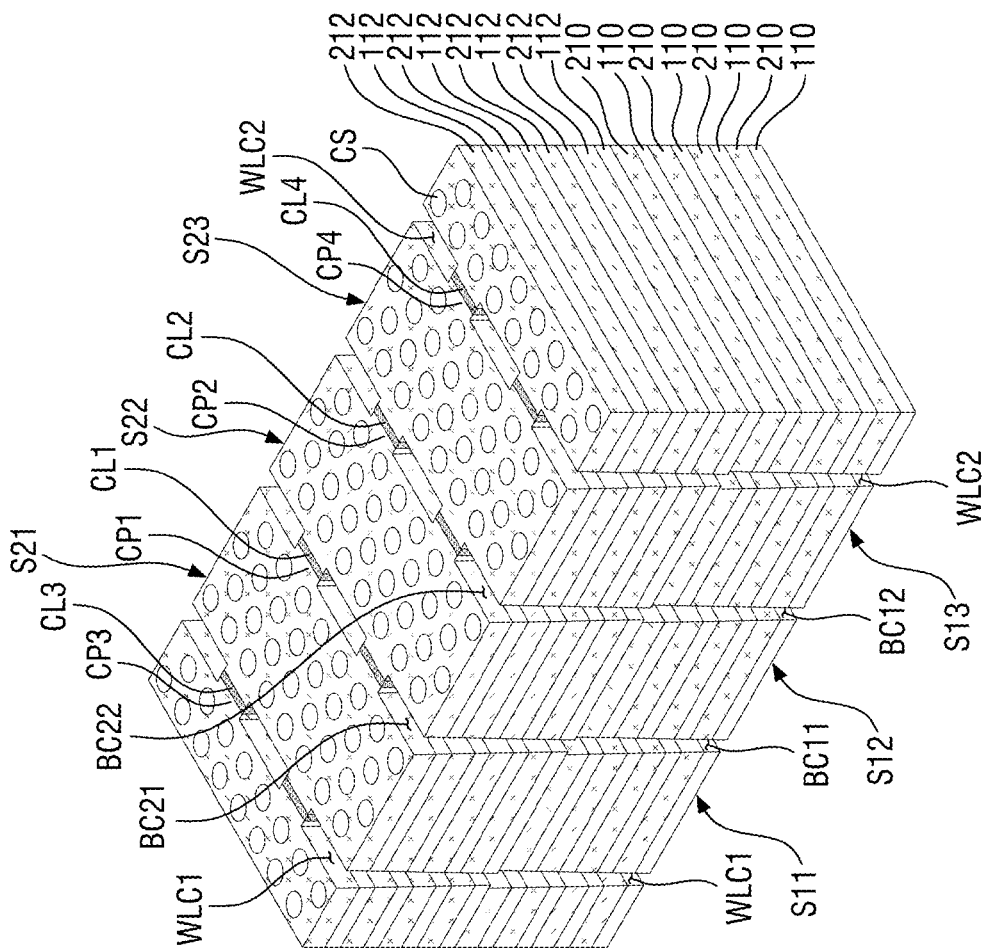

Referring to FIG. 29, a plurality of sacrificial filling patterns 230 are removed.

As a result, the first and second word line trenches WLC1 and WLC2, first block trenches BC11, and second block trenches BC12 may partially expose the first sacrificial patterns 210.

Figure 30:
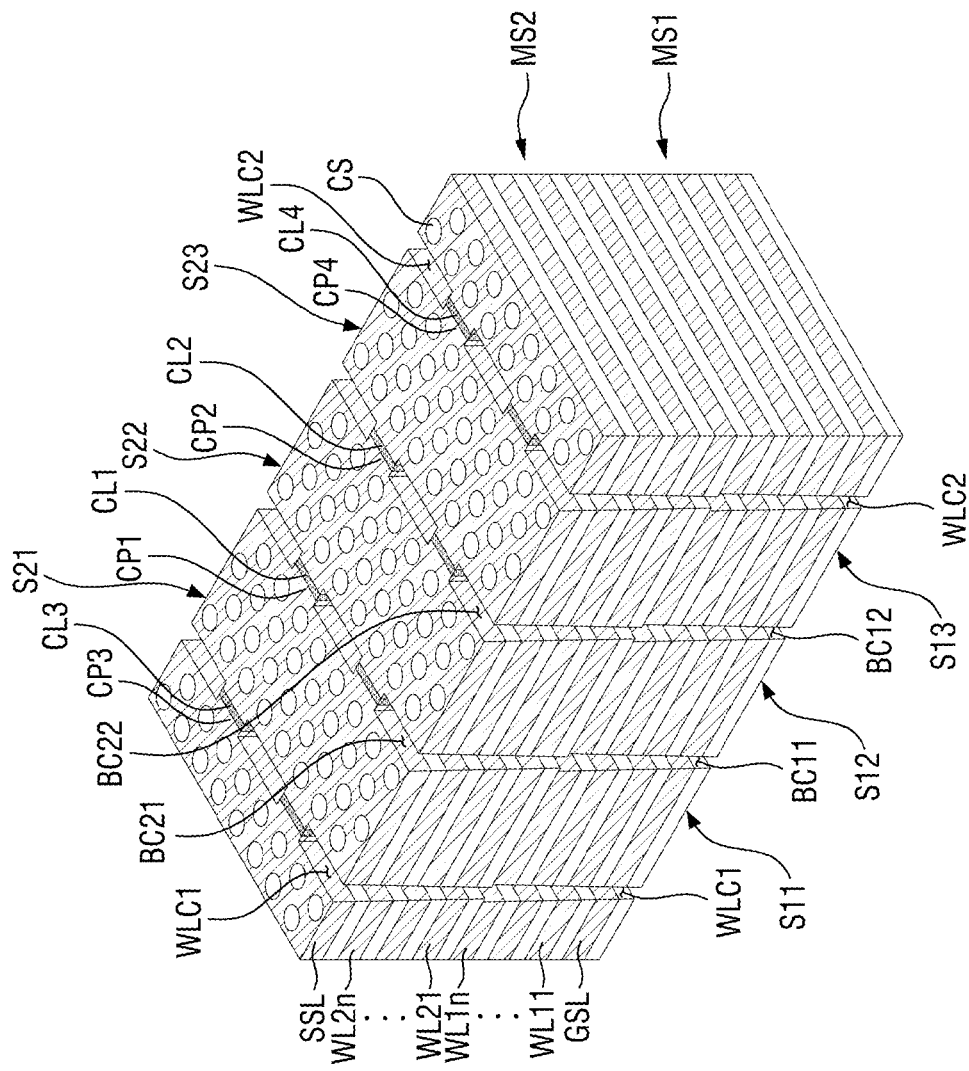

Referring to FIG. 30, a plurality of first gate electrodes (GSL and WL11 through WL1n) and a plurality of second gate electrodes (WL21 through WL2n and SSL) are formed.

The formation of the first gate electrodes (GSL and WL11 through WL1n) and the second gate electrodes (WL21 through WL2n and SSL) is almost the same as described above with reference to FIG. 26, and thus, a detailed description thereof will be omitted.

Accordingly, the first and second mold structures MS1 and MS2 can be formed.

In concluding the detailed description, those skilled in the art will appreciate that many variations and modifications may be made to the embodiments without substantially departing from the principles of the present inventive concepts. Therefore, the disclosed embodiments of the present inventive concepts are used in a generic and descriptive sense only and not for purposes of limitation.

What is claimed is:

1. A nonvolatile memory device comprising:
a substrate;
a first mold structure on the substrate and including a plurality of first gate electrodes;
a second mold structure on the first mold structure and including a plurality of second gate electrodes; and
a plurality of channel structures intersecting the plurality of first gate electrodes and the plurality of second gate electrodes by penetrating the first and second mold structures,
wherein
the first mold structure includes first and second stacks, which are spaced apart from each other by a filling layer, and
the second mold structure includes a third stack, stacked on the first stack, a fourth stack, stacked on the second stack, and first connecting parts, which connect the third and fourth stacks, the first connecting parts overlapping the filling layer in a vertical direction.

2. The nonvolatile memory device of claim 1, wherein the first mold structure includes a block trench, which separates the first and second stacks, and
the first connecting parts overlap with the block trench in a direction that is perpendicular to a top surface of the substrate.

3. The nonvolatile memory device of claim 1, wherein bottom surfaces of the first connecting parts are spaced apart from a top surface of the substrate.

4. The nonvolatile memory device of claim 1, further comprising:
a third mold structure on the second mold structure and including a plurality of third gate electrodes,
wherein the channel structures intersect the third gate electrodes by penetrating the third mold structure.

5. The nonvolatile memory device of claim 4, wherein the third mold structure includes a fifth stack, stacked on the third stack, a sixth stack, stacked on the fourth stack, and second connecting parts, which connect the fifth and sixth stacks.

6. The nonvolatile memory device of claim 4, wherein the third mold structure includes a fifth stack, stacked on the third stack, and a sixth stack, stacked on the fourth stack, and
the fifth and sixth stacks are spaced apart from each other.

7. The nonvolatile memory device of claim 1, further comprising:
a third mold structure between the first and second mold structures and including a plurality of third gate electrodes,
wherein the channel structures intersecting the third gate electrodes by penetrating the third mold structure.

8. The nonvolatile memory device of claim 7, wherein the third mold structure includes a fifth stack, stacked between the first and third stacks, a sixth stack, stacked between the second and fourth stacks, and second connecting parts, which connect the fifth and sixth stacks.

9. The nonvolatile memory device of claim 7, wherein the third mold structure includes a fifth stack, stacked between the first and third stacks, and a sixth stack, stacked between the second and fourth stacks, and
the fifth and sixth stacks are spaced apart from each other.

10. The nonvolatile memory device of claim 1, wherein the second mold structure includes a cutting line, in the first connecting parts, and
the cutting line cuts an uppermost second gate electrode among the second gate electrodes.

11. A nonvolatile memory device comprising:
a substrate;
a first mold structure on the substrate and including a plurality of first gate electrodes;
a second mold structure on the first mold structure and including a plurality of second gate electrodes;
a plurality of channel structures intersecting the first gate electrodes and the second gate electrodes by penetrating the first and second mold structures; and
bit lines extending in a first direction, the bit lines being connected to the channel structures, wherein
the first mold structure includes a first block trench, which extends in a second direction that intersects the first direction, to completely cut the first mold structure,
the second mold structure includes a plurality of second block trenches, which expose part of the first block trench, and
the second block trenches are spaced apart from one another and are arranged in the second direction.

12. The nonvolatile memory device of claim 11, wherein the first mold structure further includes a third block trench, which is spaced apart in the first direction from the first block trench and extends in the second direction to completely cut the first mold structure,
the second mold structure includes a plurality of fourth block trenches, which expose part of the third block trench, and
the fourth block trenches are spaced apart from one another and are arranged in the second direction.

13. The nonvolatile memory device of claim 11, further comprising:
a peripheral circuit structure below the substrate.

14. The nonvolatile memory device of claim 11, wherein the channel structures include semiconductor patterns, which penetrate the first and second mold structures, and information storage films, which are between the semiconductor patterns and each of the plurality of first and second gate electrodes.

15. The nonvolatile memory device of claim 14, further comprising:
a source structure between the substrate and the first mold structure,
wherein the channel structures are connected to the substrate through the source structure, and
the source structure is connected to the semiconductor patterns through the information storage films.

16. A nonvolatile memory device comprising:
a substrate;
a first mold structure on the substrate and including a plurality of first gate electrodes;
a second mold structure on the first mold structure and including a plurality of second gate electrodes;
a plurality of channel structures intersecting the first gate electrodes and the second gate electrodes by penetrating the first and second mold structures;
bit lines extending in a first direction, the bit lines being connected to the channel structures;
a first word line trench extending in a second direction that intersects the first direction, the first word line trench cutting the first gate electrodes and the second gate electrodes;
a second word line trench extending in the second direction, the second word line trench cutting the first gate electrodes and the second gate electrodes; and
a first block trench extending, between the first and second word line trenches, in the second direction, the first block trench cutting the first gate electrodes,
wherein
the first mold structure includes first and second stacks, which are separated by the first block trench, the first block trench including a filling layer, and
the second mold structure includes a third stack, stacked on the first stack, a fourth stack, stacked on the second stack, and a plurality of first connecting parts, which connect the third and fourth stacks, the first connecting parts overlapping the filling layer in a vertical direction.

17. The nonvolatile memory device of claim 16, wherein
the second mold structure includes a plurality of cutting lines, which extend in the second direction in the first connecting parts, and
the plurality of cutting lines cut an uppermost second gate electrode among the second gate electrodes.

18. The nonvolatile memory device of claim 16, wherein the second mold structure includes a fifth stack, spaced apart from the third stack by the first word line trench, and a plurality of second connecting parts, which connect the third and fifth stacks.

19. The nonvolatile memory device of claim 18, wherein the second gate electrodes are in part in the second connecting parts.

20. The nonvolatile memory device of claim 18, wherein the second mold structure further includes a cutting line, in the second connecting parts and cuts the second gate electrodes.

* * * * *